United States Patent
Kuo et al.

(10) Patent No.: US 8,934,280 B1
(45) Date of Patent: Jan. 13, 2015

(54) CAPACITIVE DISCHARGE PROGRAMMING FOR TWO-TERMINAL MEMORY CELLS

(71) Applicant: Crossbar, Inc., Santa Clara, CA (US)

(72) Inventors: Harry Kuo, Cupertino, CA (US);
Hagop Nazarian, San Jose, CA (US);
San Thanh Nguyen, Union City, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/761,132

(22) Filed: Feb. 6, 2013

(51) Int. Cl.
| | |
|---|---|
| *G11C 7/00* | (2006.01) |
| *G11C 11/00* | (2006.01) |
| *G11C 13/00* | (2006.01) |
| *G11C 11/24* | (2006.01) |
| *G11C 11/16* | (2006.01) |
| *G11C 11/22* | (2006.01) |

(52) U.S. Cl.
CPC ........ *G11C 13/0069* (2013.01); *G11C 11/1675* (2013.01); *G11C 11/221* (2013.01); *G11C 13/0002* (2013.01); *G11C 13/0004* (2013.01); *G11C 7/00* (2013.01)
USPC ........... 365/145; 365/148; 365/149; 365/163; 365/189.16

(58) Field of Classification Search
CPC .. G11C 13/0069; G11C 7/00; G11C 13/0004; G11C 13/0002
USPC ...................... 365/145, 148, 149, 163, 189.16
See application file for complete search history.

(56) References Cited

U.S. PATENT DOCUMENTS

| | | | |
|---|---|---|---|
| 4,433,468 | A | 2/1984 | Kawamata |
| 4,684,972 | A | 8/1987 | Owen et al. |
| 4,741,601 | A | 5/1988 | Saito |
| 5,139,911 | A | 8/1992 | Yagi et al. |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |

(Continued)

FOREIGN PATENT DOCUMENTS

| | | |
|---|---|---|
| EP | 2405441 A1 | 1/2012 |
| EP | 2408035 A2 | 1/2012 |
| KR | 10-2011-0014248 A | 2/2011 |
| WO | WO 2009/005699 A1 | 1/2009 |

OTHER PUBLICATIONS

Jian Hu et al., "Area-Dependent Switching in Thin Film-Silicon Devices", Materials Research Society Proceedings, 2003, pp. Al8.3.1-Al8.3.6, vol. 762, No. 1, Cambridge University Press.

(Continued)

*Primary Examiner* — Ly D Pham
(74) *Attorney, Agent, or Firm* — Ogawa P.C.

(57) ABSTRACT

Providing for capacitive programming of two-terminal memory devices is described herein. By way of example, a capacitance circuit can be precharged to a predetermined program voltage to facilitate programming one or more memory cells. The capacitance circuit can be disconnected from a power source and connected instead to the memory cell(s), enabling charge stored by the capacitance circuit to discharge through the memory cell(s). A current at the memory cell(s) can program the cell, while a total amount of discharge is limited to the charge stored by the capacitance circuit. Limiting the total charge can serve to also limit joule heating of the target memory cell, power consumption of a memory device, as well as other benefits.

20 Claims, 13 Drawing Sheets

(56) References Cited

U.S. PATENT DOCUMENTS

| | | | |
|---|---|---|---|
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,714,416 A | 2/1998 | Eichman et al. | |
| 5,751,012 A | 5/1998 | Wolstenholme et al. | |
| 5,840,608 A | 11/1998 | Chang | |
| 5,970,332 A | 10/1999 | Pruijmboom et al. | |
| 5,998,244 A | 12/1999 | Wolstenholme et al. | |
| 6,128,214 A | 10/2000 | Kuekes et al. | |
| 6,143,642 A | 11/2000 | Sur, Jr. et al. | |
| 6,180,998 B1 * | 1/2001 | Crafts | 257/659 |
| 6,259,116 B1 | 7/2001 | Shannon | |
| 6,291,836 B1 | 9/2001 | Kramer et al. | |
| 6,436,765 B1 | 8/2002 | Liou et al. | |
| 6,436,818 B1 | 8/2002 | Hu et al. | |
| 6,492,694 B2 | 12/2002 | Noble et al. | |
| 6,762,474 B1 | 7/2004 | Mills, Jr. | |
| 6,768,157 B2 | 7/2004 | Krieger et al. | |
| 6,806,526 B2 | 10/2004 | Krieger et al. | |
| 6,815,286 B2 | 11/2004 | Krieger et al. | |
| 6,838,720 B2 | 1/2005 | Krieger et al. | |
| 6,858,481 B2 | 2/2005 | Krieger et al. | |
| 6,858,482 B2 | 2/2005 | Gilton | |
| 6,864,127 B2 | 3/2005 | Yamazaki et al. | |
| 6,864,522 B2 | 3/2005 | Krieger et al. | |
| 6,881,994 B2 | 4/2005 | Lee et al. | |
| 6,927,430 B2 | 8/2005 | Hsu | |
| 6,939,787 B2 | 9/2005 | Ohtake et al. | |
| 6,946,719 B2 | 9/2005 | Petti et al. | |
| 7,020,006 B2 | 3/2006 | Chevallier et al. | |
| 7,023,093 B2 | 4/2006 | Canaperi et al. | |
| 7,026,702 B2 | 4/2006 | Krieger et al. | |
| 7,102,150 B2 | 9/2006 | Harshfield et al. | |
| 7,122,853 B1 | 10/2006 | Gaun et al. | |
| 7,187,577 B1 | 3/2007 | Wang et al. | |
| 7,221,599 B1 | 5/2007 | Gaun et al. | |
| 7,238,607 B2 | 7/2007 | Dunton et al. | |
| 7,254,053 B2 | 8/2007 | Krieger et al. | |
| 7,289,353 B2 | 10/2007 | Spitzer et al. | |
| 7,324,363 B2 | 1/2008 | Kerns et al. | |
| 7,365,411 B2 | 4/2008 | Campbell | |
| 7,405,418 B2 | 7/2008 | Happ et al. | |
| 7,426,128 B2 | 9/2008 | Scheuerlein | |
| 7,433,253 B2 | 10/2008 | Gogl et al. | |
| 7,474,000 B2 | 1/2009 | Scheuerlein et al. | |
| 7,479,650 B2 | 1/2009 | Gilton | |
| 7,521,705 B2 | 4/2009 | Liu | |
| 7,534,625 B2 | 5/2009 | Karpov et al. | |
| 7,550,380 B2 | 6/2009 | Elkins et al. | |
| 7,606,059 B2 | 10/2009 | Toda | |
| 7,615,439 B1 | 11/2009 | Schricker et al. | |
| 7,629,198 B2 | 12/2009 | Kumar et al. | |
| 7,728,318 B2 | 6/2010 | Raghuram et al. | |
| 7,729,158 B2 | 6/2010 | Toda et al. | |
| 7,749,805 B2 | 7/2010 | Pinnow et al. | |
| 7,772,581 B2 | 8/2010 | Lung | |
| 7,778,063 B2 | 8/2010 | Brubaker et al. | |
| 7,786,464 B2 | 8/2010 | Nirschl et al. | |
| 7,786,589 B2 | 8/2010 | Matsunaga et al. | |
| 7,824,956 B2 | 11/2010 | Schricker et al. | |
| 7,829,875 B2 | 11/2010 | Scheuerlein | |
| 7,835,170 B2 | 11/2010 | Bertin et al. | |
| 7,859,884 B2 | 12/2010 | Scheuerlein | |
| 7,875,871 B2 | 1/2011 | Kumar et al. | |
| 7,881,097 B2 | 2/2011 | Hosomi et al. | |
| 7,897,953 B2 | 3/2011 | Liu | |
| 7,898,838 B2 | 3/2011 | Chen et al. | |
| 7,920,412 B2 | 4/2011 | Hosotani et al. | |
| 7,924,138 B2 | 4/2011 | Kinoshita et al. | |
| 7,968,419 B2 | 6/2011 | Li et al. | |
| 7,972,897 B2 | 7/2011 | Kumar et al. | |
| 7,984,776 B2 | 7/2011 | Sastry et al. | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,054,674 B2 | 11/2011 | Tamai et al. | |
| 8,067,815 B2 | 11/2011 | Chien et al. | |
| 8,071,972 B2 | 12/2011 | Lu et al. | |
| 8,088,688 B1 | 1/2012 | Herner | |
| 8,097,874 B2 | 1/2012 | Venkatasamy et al. | |
| 8,102,698 B2 | 1/2012 | Scheuerlein | |
| 8,143,092 B2 | 3/2012 | Kumar et al. | |
| 8,144,498 B2 | 3/2012 | Kumar et al. | |
| 8,164,948 B2 | 4/2012 | Katti et al. | |
| 8,168,506 B2 | 5/2012 | Herner | |
| 8,183,553 B2 | 5/2012 | Phatak et al. | |
| 8,187,945 B2 | 5/2012 | Herner | |
| 8,198,144 B2 | 6/2012 | Herner | |
| 8,207,064 B2 | 6/2012 | Bandyopadhyay et al. | |
| 8,227,787 B2 | 7/2012 | Kumar et al. | |
| 8,231,998 B2 | 7/2012 | Sastry et al. | |
| 8,233,308 B2 | 7/2012 | Schricker et al. | |
| 8,237,146 B2 | 8/2012 | Kreupl et al. | |
| 8,258,020 B2 | 9/2012 | Herner | |
| 8,274,812 B2 | 9/2012 | Nazarian et al. | |
| 8,315,079 B2 | 11/2012 | Kuo et al. | |
| 8,320,160 B2 | 11/2012 | Nazarian | |
| 8,374,018 B2 | 2/2013 | Lu | |
| 8,385,100 B2 | 2/2013 | Kau et al. | |
| 8,394,670 B2 | 3/2013 | Herner | |
| 8,467,227 B1 | 6/2013 | Jo | |
| 2003/0174574 A1 * | 9/2003 | Perner et al. | 365/230.06 |
| 2004/0026682 A1 | 2/2004 | Jiang | |
| 2004/0170040 A1 | 9/2004 | Rinerson et al. | |
| 2005/0020510 A1 | 1/2005 | Benedict | |
| 2005/0029587 A1 | 2/2005 | Harshfield | |
| 2005/0041498 A1 * | 2/2005 | Resta et al. | 365/203 |
| 2005/0062045 A1 | 3/2005 | Bhattacharyya | |
| 2006/0281244 A1 | 12/2006 | Ichige et al. | |
| 2007/0008773 A1 | 1/2007 | Scheuerlein | |
| 2007/0015348 A1 | 1/2007 | Hsu et al. | |
| 2007/0087508 A1 | 4/2007 | Herner | |
| 2007/0090425 A1 | 4/2007 | Kumar et al. | |
| 2007/0091685 A1 * | 4/2007 | Guterman et al. | 365/185.22 |
| 2007/0105284 A1 | 5/2007 | Herner | |
| 2007/0105390 A1 | 5/2007 | Oh | |
| 2007/0205510 A1 | 9/2007 | Lavoie et al. | |
| 2007/0228414 A1 | 10/2007 | Kumar et al. | |
| 2007/0284575 A1 | 12/2007 | Li et al. | |
| 2007/0290186 A1 | 12/2007 | Bourim et al. | |
| 2008/0002481 A1 | 1/2008 | Gogl et al. | |
| 2008/0006907 A1 | 1/2008 | Lee et al. | |
| 2008/0048164 A1 | 2/2008 | Odagawa | |
| 2008/0089110 A1 | 4/2008 | Robinett et al. | |
| 2008/0090337 A1 | 4/2008 | Williams | |
| 2008/0106925 A1 | 5/2008 | Paz De Araujo et al. | |
| 2008/0106926 A1 | 5/2008 | Brubaker et al. | |
| 2008/0185567 A1 | 8/2008 | Kumar et al. | |
| 2008/0206931 A1 | 8/2008 | Breuil et al. | |
| 2008/0220601 A1 | 9/2008 | Kumar et al. | |
| 2008/0278990 A1 | 11/2008 | Kumar et al. | |
| 2008/0304312 A1 | 12/2008 | Ho et al. | |
| 2008/0311722 A1 | 12/2008 | Petti et al. | |
| 2009/0001345 A1 | 1/2009 | Schricker et al. | |
| 2009/0014707 A1 | 1/2009 | Lu et al. | |
| 2009/0052226 A1 | 2/2009 | Lee et al. | |
| 2009/0095951 A1 | 4/2009 | Kostylev et al. | |
| 2009/0152737 A1 | 6/2009 | Harshfield | |
| 2009/0168486 A1 | 7/2009 | Kumar | |
| 2009/0231910 A1 | 9/2009 | Liu et al. | |
| 2009/0250787 A1 | 10/2009 | Kutsunai | |
| 2009/0256130 A1 | 10/2009 | Schricker | |
| 2009/0257265 A1 | 10/2009 | Chen et al. | |
| 2009/0267047 A1 | 10/2009 | Sasago et al. | |
| 2009/0298224 A1 | 12/2009 | Lowrey | |
| 2009/0321789 A1 | 12/2009 | Wang et al. | |
| 2010/0012914 A1 | 1/2010 | Xu et al. | |
| 2010/0019221 A1 | 1/2010 | Lung et al. | |
| 2010/0019310 A1 | 1/2010 | Sakamoto | |
| 2010/0032638 A1 | 2/2010 | Xu | |
| 2010/0032640 A1 | 2/2010 | Xu | |
| 2010/0044708 A1 | 2/2010 | Lin et al. | |

(56) References Cited

U.S. PATENT DOCUMENTS

| | | | |
|---|---|---|---|
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1* | 12/2011 | Li et al. ........... 365/148 |
| 2011/0305064 A1 | 12/2011 | Jo et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043621 A1 | 2/2012 | Herner |
| 2012/0043654 A1 | 2/2012 | Lu et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0305874 A1 | 12/2012 | Herner |

OTHER PUBLICATIONS

Andre Dehon, "Array-Based Architecture for FET-Based, Nanoscale Electronics", IEEE Transactions on Nanotechnology, Mar. 2003, pp. 23-32, vol. 2, No. 1.

Herb Goronkin et al., "High-Performance Emerging Solid-State Memory Technologies", MRS Bulletin, Nov. 2004, pp. 805-813, www.mrs.org/publications/bulletin.

Gerhard Muller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North-Holland Publishing Company.

J. Campbell Scott, "Is There an Immortal Memory?", www.sciencemag.org, Apr. 2, 2004, pp. 62-63, vol. 304, No. 5667.

S.H. Lee et al., "Full Integration and Cell Characteristics for 64Mb Nonvolatile PRAM", 2004 Symposium on VLSI Technology Digest of Technical Papers, pp. 20-21, 2004 IEEE.

Stephen Y. Chou et al., "Imprint Lithography With 25-Nanometer Resolution", Science, Apr. 5, 1996, pp. 85-87, vol. 272.

S. Zankovych et al., "Nanoimprint Lithography: Challenges and Prospects", Institute of Physics Publishing, Nanotechnology 12, 2001, pp. 91-95.

A. Avila et al., "Switching in Coplanar Amorphous Hydrogenated Silicon Devices", Solid-State Electronics 44, 2000, pp. 17-27.

Jian Hu et al., "Switching and Filament Formation in Hot-Wire CVD P-Type A-Si:H Devices", Science Direct, Thin Solid Films 430, 2003, pp. 249-252, www.sciencedirect.com.

S. Hudgens et al,. "Overview of Phase-Change Chalcogenide Nonvolatile Memory Technology", MRS Bulletin, Nov. 2004, pp. 829-832, www.mrs.org/publications/bulletin.

K. Terabe et al., "Quantized Conductance Atomic Switch", Nature, vol. 433, Jan. 6, 2005, pp. 47-50, www.nature.com/ nature.

Michael Kund et al., "Conductive Bridging RAM (CBRAM): An Emerging Non-Volatile Memory Technology Scalable to Sub 20nm", IEEE, 2005.

W. Den Boer, "Threshold Switching in Hydrogenated Amorphous Silicon", American Institute of Physics, 1982, pp. 812-813.

P.G. Lecomber et al., "The Switching Mechnism in Amorphous Silicon Junctions", Journal of Non-Crystalline Solids 77 & 78, 1985, pp. 1373-1382, North-Holland, Amsterdam.

A. E. Owen et al., "Switching in Amorphous Devices", Int. J. Electronics, 1992, pp. 897-906, vol. 73, No. 5.

M. Jafar et al., "Switching in Amorphous-Silicon Devices", The American Physical Society, 1994, pp. 611-615, vol. 49, No. 19.

Stikeman, Alexandra, "Polymer Memory—The Plastic Path to Beller Data Storage," Technology Review, Sep. 2002, p. 31, www.technology review.com.

Yong Chen et al. "Nanoscale molecular-switch crossbar circuits," Nanotechnology 14, 2003, pp. 462-468, vol. 1.14, Institute of Physics Publishing.

C.P. Collier et al. "Electronically Configurable Molecular-Based Logic Gates," Science, Jul. 16, 1999, pp. 391-395, vol. 285, No. 5426.

Office Action for U.S. Appl. No. 11/875,541, dated Jul. 22, 2010.
Office Action for U.S. Appl. No. 11/875,541, dated Mar. 30, 2011.
Office Action for U.S. Appl. No. 11/875,541, dated Oct. 5, 2011.
Office Action for U.S. Appl. No. 11/875,541, dated Jun. 8, 2012.

Choi, Jang Wook, "Molecular Electronic Crossbar Memory Circuits", Bistable [2]Rotaxane Based Molecular Electronics: Fundamentals and Applications, Chapter 3, pp. 79-124, Dissertation, California Institute of Technology.

Sung-Hyun Jo et al., "A Silicon-Based Crossbar Ultra-High-Density Non-Volatile Memory", SSEL Annual Report 2007.

International Search Report for PCT/US2009/060023, filed on Oct. 8, 2009.

Waser, R et al., "Nanoionics-based Resistive Switching Memories", Nature Materials, Nov. 2007, pp. 833-835, vol. 6.

Written Opinion of the International Searching Authority for PCT/US2009/060023, filed on Oct. 8, 2009.

Ex Parte Quayle Action for U.S. Appl. No. 12/826,653, dated May 8, 2012.

International Search Report for PCT/US2011/040090, filed on Jun. 10, 2011.

Written Opinion of the International Searching Authority for PCT/US2011/040090, filed on Jun. 10, 2011.

Notice of Allowability for U.S. Appl. No. 13/158,231, dated Apr. 17, 2012.

Office Action for U.S. Appl. No. 12/835,704, dated Sep. 21, 2011.
Office Action for U.S. Appl. No. 12/835,704, dated Mar. 1, 2012.
Advisory Action for U.S. Appl. No. 12/835,704, dated Jun. 8, 2012.

International Search Report and Written Opinion for PCT/US2011/046035, filed on Jul. 29, 2011.

Office Action for U.S. Appl. No. 12/861,650, dated Jan. 25, 2012.
Notice of Allowability for U.S. Appl. No. 12/861,650, dated Jun. 19, 2012.

Sung Hyun Jo et al., "Programmable Resistance Switching in Nanoscale Two-Terminal Devices," Supporting Information, Dec. 29, 2008, pp. 1-4, vol. 9. No. 1, Department of Electrical Engineering and Computer Science, the University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., Si-Based Two-Terminal Resistive Switching Nonvolatile Memory, 2008, IEEE.

Sung Hyun Jo et al., "Nanoscale Memristor Device as Synapse in Neuromorphic Systems", Nano Letters, 2010, pp. 1297-1301, pubs.acs.org/NanoLett, A-E, American Chemical Society Publications.

(56) References Cited

OTHER PUBLICATIONS

Wei Lu et al., "Nanoelectronics from the bottom up," Nature Materials—Review Articles | Insight, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices," 2006.
Sung Hyun Jo et al., "Experimental, Modeling and Simulation Studies of Nanoscale Resistance Switching Devices," 2009, IEEE.
Sung Hyun Jo et al., "Nonvolatile Resistive Switching Devices Based on Nanoscale Metal/Amorphous Silicon/Crystalline Silicon Junctions," Mater. Res. Soc. Symp. Proc., 2007, vol. 997, Materials Research Society.
Sung Hyun Jo et al., "Si Memristive Devices Applied to Memory and Neuromorphic Circuits."
Wei Lu et al., "Supporting Information," 2008.
Sung Hyun Jo et al., "High-Density Crossbar Arrays Based on a Si Memristive System," Nano Letters, 2009, pp. 870-874, vol. 9, No. 2, American Chemical Society Publications.
Sung Hyun Jo et al., "High-Density Crossbar Arrays Based on a Si Memristive System," Supporting Information, 2009, pp. 1-4.
Sung Hyun Jo et al., "Programmable Resistance Switching in Nanoscale Two-Terminal Devices," Nano Letters, 2009, pp. 496-500, vol. 9, No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24, No. 10, Jpn. J. Appl. Phys.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids 115, 1989, pp. 168-170, Elsevier Science Publishers B.V., North-Holland.
A. Moopenn et al., "Programmable Synaptic Devices for Electronic Neural Nets", Control and Computers, 1990, pp. 37-40, vol. 18, No. 2.
P.G. Le Comber, "Present and Future Applications of Amorphous Silicon and Its Alloys", Journal of Non-Crystalline Solids 115, 1989, pp. 1-13, Elsevier Science Publishers B.V., North-Holland.
Hu, J., et. al. "AC Characteristics of Cr/p/sup +/ A-Si:HIV Analog Switching Devices." IEEE Transactions on Electron Devices, Sep. 2000, pp. 1751-1757, vol. 47, No. 9.
Owen, A.E. et al., "New amorphous-silicon electrically programmable nonvolatile switching device," Solid-State and Electron Devices, IEEE Proceedings I, Apr. 1982, pp. 51-54, vol. 129, No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures," Philosophical Magazine B, 1991, pp. 349-369, vol. 63, No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Dong, Y., et al., "Si/a-Si Core/Shell Nanowires as Nonvolatile Crossbar Switches", Nano Letters, Jan. 2008, pp. 386-391, vol. 8, No. 2.
European Search Report for Application No. EP 09 81 9890.6 of Mar. 27, 2012.
D. A. Muller, et al., "The Electronic Structure at the Atomic Scale of Ultrathin Gate Oxides", Nature, Jun. 1998, pp. 758-761, vol. 399, No. 24.
Sune, J. et al., "Nondestructive Multiple Breakdown Events in Very Thin SiO2 Films." Applied Physics Letters, 1989, vol. 55 No. 128.
Herve Marand, "Materials Engineering Science", MESc 5025, Chapter 7, University of Vermont, http://www.files.chem.vt.edu/chemdeptimarand/MEScchap6-1 c.pdf.

Owen, A.E. et al., "Electronic switching in amorphouse silicon devices: properties of the conducting filament", Proceedings of the 5th International Conference on Solid-State and Integrated Circuit Technology, 1998, pp. 830-833.
Jo, Sung Hyun, "Nanoscale Memristive Devices for Memory and Logic Applications", Thesis, University of Michigan, 2010.
Office Action for U.S. Appl. No. 12/894,098, dated Aug. 1, 2012.
Sung Hyun Jo et al., "CMOS Compatible Nanoscale Nonvolatile Resistance Switching Memory," Nano Letters, 2008, pp. 392-397, vol. 8, No. 2, American Chemical Society Publications.
Office Action for U.S. Appl. No. 12/582,086, dated Apr. 19, 2011.
Office Action for U.S. Appl. No. 12/582,086, dated Sep. 6, 2011.
Notice of Allowance for U.S. Appl. No. 12/582,086, dated Oct. 21, 2011.
International Search Report for PCT/US2009/061249, filed on Oct. 20, 2009.
Written Opinion of the International Searching Authority for PCT/US2009/061249, filed on Oct. 20, 2009.
Office Action for U.S. Appl. No. 12/861,650, dated Oct. 16, 2012.
Notice of Allowance for U.S. Appl. No. 12/894,087, dated Oct. 25, 2012.
Notice of Allowance for U.S. Appl. No. 13/149,807, dated Oct. 29, 2012.
Notice of Allowance for U.S. Appl. No. 12/861,666, dated Nov. 14, 2012.
Office Action for U.S. Appl. No. 13/156,232, dated Nov. 26, 2012.
Notice of Allowance for U.S. Appl. No. 13/290,024, dated Nov. 28, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.

(56) References Cited

OTHER PUBLICATIONS

Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 12/835,699, dated Aug. 24, 2011.
Notice of Allowance for U.S. Appl. No. 12/835,699, dated Feb. 6, 2012.
Office Action for U.S. Appl. No. 12/833,898, dated Apr. 5, 2012.
European Search Report for Application No. EP 1100 5207.3 of Oct. 12, 2011.
Notice of Allowance for U.S. Appl. No. 12/833,898, dated May 30, 2012.
Notice of Allowance for U.S. Appl. No. 12/939,824, dated May 11, 2012.
Notice of Allowance for U.S. Appl. No. 12/940,920, dated Oct. 5, 2011.
Office Action for U.S. Appl. No. 13/314,513, dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653, dated Apr. 25, 2012.
International Search Report for PCT/US2011/045124, filed on Jul. 22, 2011.
Written Opinion of the international Searching Authority for PCT/US2011/045124, filed on Jul. 22, 2011.
Peng-Heng Chang et al., "Aluminum spiking at contact windows in Al/Ti-W/Si", Appl. Phys. Lett., Jan. 25, 1998, pp. 272-274, vol. 52, No. 4, American Institute of Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 mailed Aug. 8, 2012.
Office Action for U.S. Appl. No. 13/417,135, dated Oct. 9, 2012.
Notice of Allowance for U.S. Appl. No. 13/532,019, dated Nov. 14, 2012.
Office Action for U.S. Appl. No. 13/149,653, dated Nov. 20, 2012.
Office Action of U.S. Appl. No. 13/436,714, dated Dec. 7, 2012.

* cited by examiner

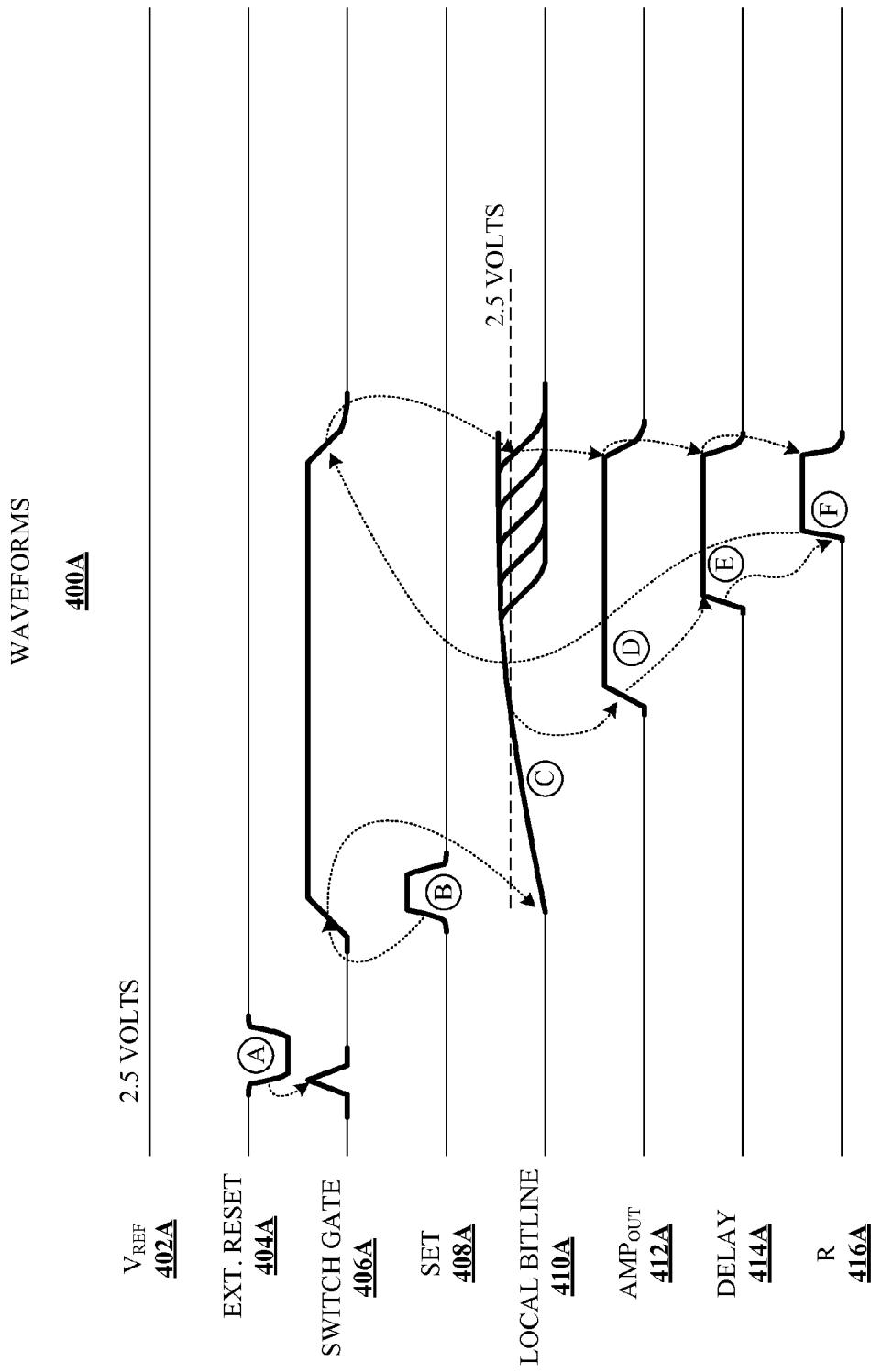

CAPACITIVE DISCHARGE PROGRAMMING FOR TWO-TERMINAL MEMORY CELLS

TECHNICAL FIELD

The subject disclosure relates generally to solid state two-terminal memory cells for storing data, and more particularly to programming two-terminal memory cells utilizing capacitive discharge programming.

BACKGROUND

Semiconductor memory technology has enabled remarkable advances in electronic memory. Moore's law approximates the rate at which semiconductor technology advances over time, and it has been relatively prescient for about the past forty years. These advancements often involve significant changes in what constitutes a memory, or a memory cell, including the materials, structure, or circuit design of the underlying memory. But the basic function of electronic memory has stayed generally the same, despite changes in technology that have facilitated access to ever-increasing amounts of higher quality media for diverse uses.

One recent technological advance in memory technology is the solid state two-terminal memory. Solid state two-terminal memory generally includes a material having particular electronic characteristics positioned between two conductive electrodes. In the context of electronic memory, the material is generally selected to have two or more stable or semi-stable, yet distinct states. These distinct states can be attributed to a single binary bit of information (e.g., or more than a single binary bit in the case of multi-level cells capable of multiple distinct states). The capacity for a device to reliably represent at least one binary bit of information allows the device to function as a fundamental memory cell. For a two-terminal memory cell, the memory cell can be programmed to a program state or erased to a non-program state by a process applied to the two conductive electrodes.

Operation processes for two-terminal memory cells can vary significantly among different technology devices. An operation process generally refers to a program process, erase process or read process in the context of a memory cell, though other similar processes can exist (e.g., block erase, block program, line program, and so on). In light of the above, improvements to two-terminal memory cells are desired.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Aspects of the subject disclosure provide for capacitive programming of two-terminal memory devices. In some aspects, an amount of charge applied to programming a memory cell can be limited to a predetermined charge, by pre-charging a capacitance circuit to a predetermined program voltage. A connection between the capacitance circuit and a power source can be opened, preventing further current flow through the capacitance circuit from the power source. A second connection between the capacitance circuit and a target memory cell can be closed, enabling charge stored by the capacitance circuit to generate a current at the target memory cell. Such charge can be sufficient to program the target memory cell, while limiting a total amount of charge associated with programming the target memory cell. This can serve to limit joule heating of the target memory cell, limit power consumption, as well as other benefits. In some disclosed aspects, the capacitive discharge can obviate a need for program current compliance since the program bias is not actively driven.

In particular aspects, capacitive programming can further comprise a post programming inhibit bias. A memory cell can be programmed via connection to a capacitance circuit having been precharged to a program voltage. Following programming of the memory cell, the connection to the capacitance circuit can be terminated. In addition, a post program inhibit bias can be applied to the memory cell to maintain a minimum bias voltage. This can facilitate disturb prevention in neighboring memory cells that share one or more conductive terminals (e.g., bitline, wordline, etc.) with the memory cell.

In one or more additional aspects, a program operation for a two-terminal memory cell can be facilitated by a program termination process. The program termination process can detect occurrence of a state change in the two-terminal memory cell, indicating the cell has been programmed. In response to detecting the state change the two-terminal memory cell can be isolated from a capacitance source, and optionally be connected to an inhibit bias. By detecting the state change and isolating the memory cell from the capacitance source, joule heating is further reduced, while preserving charge at the capacitance source and further improving power consumption.

In at least one further aspect, capacitive programming as described herein can be implemented in conjunction with a current limitation as the state change detection parameter. The current limitation can be facilitated, for instance, by a current mirror circuit, or other suitable current limiting circuit. This current limiting can limit a magnitude of a program current observed at a target memory cell in response to programming by a capacitance circuit. Though precharging the capacitance circuit limits a total amount of charge delivered to the target memory cell, the current limitation also reduces an amount of charge that discharges to the target memory cell per unit time, or the dQ/dt of the discharge. This can minimize short-term heating, eliminate large power transient spikes, further preserve power, and protect the memory cell over long duration operations.

In one or more additional aspects of the subject disclosure, capacitive programming can be implemented through a local bitline associated with a target memory cell. The local bitline can be connected to a capacitive circuit that is precharged to program voltage. The local bitline is then connected to the capacitive circuit until being charged to the program voltage. Generally, the local bitline can have a lower capacitance than the capacitive circuit, resulting in less charge being stored at the local bitline. This can serve to reduce a total amount of charge consumed in programming a memory cell connected to the local bitline. In addition, a program termination circuit can be connected to the local bitline (or a local wordline) to identify a state change in the memory cell, and open a connection between the local bitline and memory cell in response to the state change. Moreover, a current limiter can be provided to place a limit on a maximum program current observed by the memory cell in response to being connected to the local bitline. As a result, this and other aspects can provide significant reduction in power consumption for a two-terminal memory system, reduce joule heating, and improve lifespan and efficacy of memory cells and associated memory devices over long duration operation.

In one or more further aspects, disclosed is a method for programming a two-terminal memory cell. The method can comprise connecting a power source to a capacitor and precharging the capacitor to a programming voltage. Additionally, the method can comprise selecting a two-terminal memory cell and connecting the precharged capacitor to a program terminal of the two-terminal memory cell, and connecting a second terminal of the two-terminal memory cell to ground. Moreover, the method can comprise controlling a magnitude of current flowing through the two-terminal memory cell in conjunction with the programming.

In yet other aspects, the subject disclosure provides a semiconductor memory device. The semiconductor memory device can comprise a power source configured to generate and output a selected voltage within a predetermined range of voltages, and a bitline and a wordline, the bitline having an associated bitline capacitance value. Further, the semiconductor memory device can comprise a two-terminal memory cell connected at one terminal to the wordline and connected at a second terminal to a select transistor and to the bitline, the select transistor configured to electrically connect or electrically isolate the two-terminal memory cell from the bitline in response to activation or deactivation of the select transistor. Additionally, the semiconductor memory device can comprise a program control circuit configured to set the selected voltage to a program voltage value; precharge the bitline to the program voltage value and initiate discharging the precharged bitline through the two-terminal memory cell to facilitate programming the two-terminal memory cell and a current inhibitor circuit configured to limit a current through the two-terminal memory cell in response to the discharging. In at least one other aspect of the subject disclosure, the semiconductor memory device can also comprise a charge preservation circuit configured to identify a change in program state of the two-terminal memory cell, and to terminate the discharging in response to identifying the change in program state.

Further to the above, the subject disclosure can comprise a memory circuit. The memory circuit can comprise an electrical switch that selectively connects and disconnects a voltage supply to a capacitance circuit comprising a bitline connected to a capacitor and a set of second electrical switches that, respectively, selectively connect and disconnect the capacitance circuit to respective ones of a set of local bitlines associated with memory cells of the memory circuit. Moreover, the memory circuit can comprise a control circuit configured to charge the capacitance circuit and the set of local bitlines and limit an amount of charge consumed in programming the memory cells to a maximum charge. Particularly, the control circuit can be configured to close the electrical switch in response to initiation of a program operation, charge the capacitance circuit, and open the electrical switch in response to charging the capacitance circuit and closes at least one of the set of second electrical switches to charge a plurality of the set of local from the capacitance circuit, to facilitate discharging a program current through a plurality of memory cells connected to respective ones of the plurality of the set of local bitlines. In addition to the foregoing, a total capacitance of the capacitance circuit comprises a parasitic capacitance of the bitline and a capacitance value of the capacitor.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

BRIEF DESCRIPTION OF THE DRAWINGS

FIG. 4A illustrates a diagram of example control waveforms that can be employed for operating the circuit of FIG. 4.

DETAILED DESCRIPTION

Figure 1:
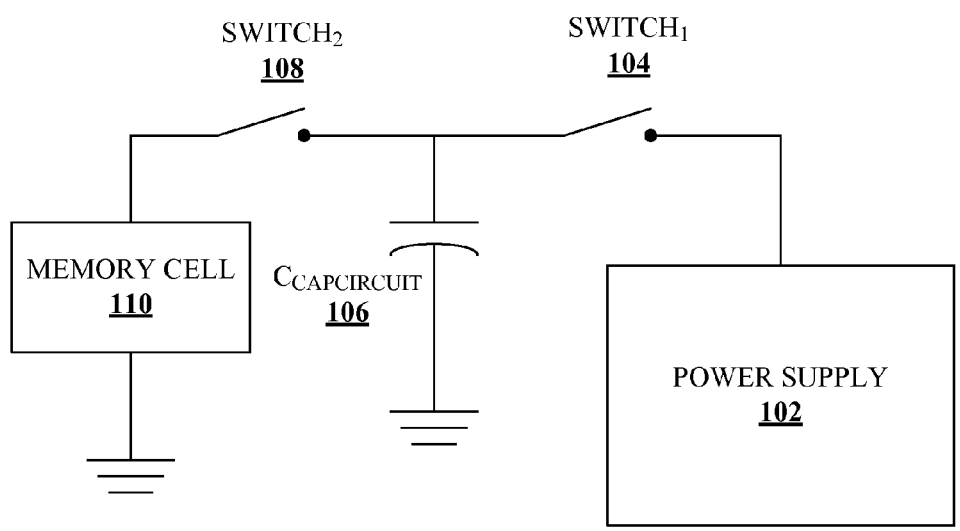
FIG. 1 illustrates a circuit diagram of an example system that provides capacitive programming for a two-terminal memory cell in some disclosed aspects.

The disclosed subject matter is described with reference to the drawings, wherein like reference numerals are used to refer to like elements throughout the description. In the following description, for purposes of explanation, numerous specific details are set forth in order to provide a thorough understanding of the subject disclosure. It may be evident, however, that the disclosed subject matter may be practiced without these specific details. In other instances, well-known structures and devices are shown in block diagram, schematic form or circuit form in order to facilitate describing various alternative aspects or combinations of one or more aspects.

The disclosure provides for capacitive programming of two-terminal memory cells, in various embodiments. Two-terminal memory devices, as utilized herein, comprise circuit components having two electrical contacts with an active region between the two conductive contacts. The active region of the two-terminal memory device exhibits linear or non-linear non-volatile resistive characteristics in response to a voltage difference applied at the two conductive contacts. Examples of two-terminal memory devices, though not exhaustive, can include resistive-switching memory, phase-change memory (PCM), a phase-change random access memory (PCRM), a magnetoresistive access memory (MRAM) or a ferroelectric random access memory (FeRAM), or the like, or a suitable combination thereof. As utilized herein, where one type of two-terminal memory device is referenced (e.g., RRAM), it should be appreciated that the scope of the subject disclosure contemplates substitution of other suitable types of two-terminal memory (e.g., PCM, PCRM, MRAM, FeRAM, . . . ) for the referenced two-terminal memory, except where otherwise clear from context.

One example of resistive-switching two-terminal memory is a resistive random access memory (RRAM). RRAM can include a filamentary-based RRAM, which in turn can include: a p-type silicon bearing layer (e.g., p-type polysilicon, p-type SiGe), a resistive switching material (e.g. an undoped amorphous silicon layer, a material having intrinsic characteristics, a silicon oxide, or the like), and an active metal layer for providing filament forming ions to the resistive switching material (e.g., silver (Ag), gold (Au), nickel (Ni), aluminum (Al), chromium (Cr), iron (Fe), manganese (Mn), tungsten (W), vanadium (V), cobalt (Co), platinum (Pt), and palladium (Pd)). In some embodiments, barrier layers may be disposed between the active metal layer and the resistive switching material and/or on top of the active metal layer (e.g. titanium, titanium oxide, or the like.)

Some details pertaining to RRAM similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, a unipolar memory cell, once initially programmed, can be later programmed in response to a first positive voltage (e.g., three volts) and erased in response to a second positive voltage (e.g., between four and five volts). Bipolar memory cell, on the other hand, becomes programmed (high resistance to low resistance change) in response to a positive voltage and erased (low resistance change to high resistance change) in response to a negative voltage. Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Resistive-switching memory cells have several advantages over FLASH or metal oxide semiconductor (MOS) memory devices. First, resistive-switching technology can generally be small, consuming silicon area on the order of $4F^2$ per adjacent resistive-switching device (e.g., a memory cell comprising two resistive-switching devices would therefore be approximately $8F^2$ if constructed in adjacent silicon space). Non-adjacent resistive-switching devices, e.g., stacked above or below each other, can consume as little as $4F^2$ for a set of multiple non-adjacent devices. This leads to great semiconductor component density and memory density, and low manufacturing costs for a given number of transistors. Resistive-switching memory also has fast programming speed and low programming current, and smaller cell sizes enabling greater component densities. Additionally, resistive-switching memory cells can be non-volatile, having the capacity to store data without continuous application of power. In addition to the foregoing, resistive-switching memory cells can generally be built between metal interconnect layers, enabling resistive-switching based devices to be usable for two-dimension as well as three-dimension semiconductor architectures.

To program a filamentary-based resistive-switching memory cell, a suitable program voltage can be applied across the memory cell causing a conductive filament to form through a relatively high electrical resistance portion of the memory cell. This causes the memory cell to change from a relatively high resistive state, to a relatively low resistive state. An erase process can be implemented to reverse the process, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing binary information.

Two-terminal memory cells are generally quick to program and responsive, changing state readily in response to a program voltage. However, not all mechanisms for programming a memory cell are efficient. For instance, applying a program voltage for a program clock cycle of a predetermined duration is one typical way of programming a resistive-switching memory cell. Though this is a common program technique, it has several drawbacks. First, the program voltage is actively driven, and thus an amount of charge consumed in implementing the program is limited only by the duration of the program clock cycle. Thus, where the resistive-switching memory cell changes state in response to the program voltage in only a fraction of the program clock cycle, a current caused by the program voltage for a remaining fraction of the program clock cycle is wasted power and may cause reliability and performance degradation of the cell. Moreover, this wasted power tends to cause joule heating in the RRAM memory cell and in some cases in related circuit components. Joule heating is a well known cause of circuit degradation, and its minimization is generally desired.

Another challenge with two-terminal memory arrays relates to avoiding inadvertent programming of cells neighboring a target cell. During a program operation of the target cell, neighboring a target cell may require application of a maintenance voltage to retain a program state, depending on requirements of the neighboring cells in question. If a program voltage applied to a bitline of the target cell affects voltage on neighboring bitlines, the neighboring cells could be inadvertently programmed along with the target cell. Thus, some mechanism to insulate neighboring bitlines from the target voltage is generally desired as well.

To address these and related problems, the subject disclosure provides for capacitive programming of two-terminal memory cells, including but not limited to resistive-switching memory cells. Capacitive programming can comprise precharging a capacitive circuit to a predetermined charge, a predetermined program voltage, or the like. The capacitive circuit is then disconnected from a power source, and utilized to charge a target memory cell. An inhibit voltage can then be applied to the target memory cell in some disclosed aspects, to mitigate or avoid inadvertent programming of neighboring cells. In general, capacitive programming limits a total amount of charge that can be consumed in programming the target memory cell to the charge applied to the capacitive circuit. In other words, because the target memory cell does not observe a program voltage that is actively driven by a power source, the total amount of charged is capped to a finite amount.

In some aspects of the subject disclosure, a capacitive circuit can comprise a bitline of a memory device, a wordline, a data line, or another suitable conductor within the memory device. A capacitance of the conductor can be utilized to determine a suitable charge required to deliver a desired program voltage or program current to a target memory cell. In at least one aspect, the capacitive circuit can comprise only the bitline, . . . , of the memory device, in which case a bitline capacitance provides the capacitance of the capacitive circuit. In another aspect(s), the capacitive circuit can comprise the bitline in conjunction with a capacitor element, in which case the capacitance of the capacitive circuit includes the bitline capacitance plus the capacitor element's capacitance.

Capacitance programming has several advantages. Since the amount of the charge is limited by the size of the capacitance and direct current path, the programming power source can be inactive during programming. This limits waste of excess DC current. In addition, capacitive programming can reduce stress on the memory cells.

In regards to heating, a maximum amount of charge that can be discharged through a target memory cell is limited by a precharge on a capacitive circuit. The target memory cell is isolated from other DC current paths, so other sources of charge/current do not contribute to joule heating at the target memory cell. In aspects where a program termination circuit is employed in conjunction with the capacitive programming, the maximum amount of charge discharged through the target memory cell can be reduced further. This can further reduce power consumption, reduce joule heating and increase longevity and reliance of the target memory cell. The termination circuit can also improve the programming performance of the memory device.

In addition to the foregoing, capacitive programming as described herein can facilitate high throughput programming. By avoiding constant DC current for programming memory cells, an increased number of bits can be programmed for a given programming operation. An increase in number of programmed cells for a given operation (or, e.g., a given amount of time) is one typical definition of increased programming throughput, for instance. Further, it can be easier to meet $I_{CC,PGM}$ datasheet specifications for memory cell programming by avoiding constant DC current in the programming operation. For various aspects of the subject disclosure, an amount of charge provided to a capacitive circuit can be related (e.g., proportional, linear, non-linear, and so forth) to a number of memory cells selected for programming in a given program operation. In at least one aspect, a capacitance of the capacitive circuit can be configured at least in part on a number of memory cells typically selected for programming, or a specified range of memory cells for concurrent programming, or the like, or a suitable combination thereof. Particularly, the capacitance of the capacitance circuit can be configured by selecting a particular size capacitor to achieve a target capacitance configuration, or a suitable size bitline, wordline, or the like, having a desired capacitance can be selected for a memory device, or a suitable combination thereof. An amount of charge utilized for precharging the capacitive circuit can be given by the relationship:

$$i = \left(\frac{dQ}{dt}\right) = C * \left(\frac{dV}{dt}\right)$$

where i is the programming current associated with a programmed memory cell (e.g., current for a low resistance state in regard to a resistive-switching memory cell), Q is total programming charge, C is a total capacitance of the capacitive circuit, and V is a voltage of the capacitance circuit. Utilizing the above relationship, an amount of charge Q can be determined for a capacitive circuit of capacitance C to meet a required programming current i, or program voltage V. For programming multiple cells, a total programming current $I_{total}$ is i equal to a number of memory cells being programmed concurrently multiplied by a program current of a single memory cell. So a total program current to program a thousand memory cells having a program current of 10 micro amps (µA), would be 10 milliamps (mA).

According to at least some aspects of the subject disclosure, capacitive programming can be provided for multi-level memory cells. Programming current for multi-level programming can still be governed by the above relationship for program current i. However, different program currents can be associated with different program states of a multi-level memory cell. As a particular example, take the case of a two-terminal memory cell having a first program state at 10 µA, a second program state at 15 µA, and a third program state at 20 µA (and a non-program state at a much lower current, e.g., ~$10^{-11}$ amperes).

To increase or decrease a programming current, a capacitance of the capacitive circuit can be increased/decreased to achieve a target program current at a memory cell(s). Capacitance of the capacitive circuit can be increased, for instance, by connecting one or more additional capacitor elements to the capacitive circuit. Thus, as a specific example, a capacitive element can be joined in parallel to a bitline of a memory device to yield a capacitive circuit having a capacitance different from (e.g., higher, lower) a bitline capacitance of the bitline alone. Known mechanisms for changing capacitance of a circuit by adding or subtracting capacitor elements (e.g., in series, in parallel, a combination of series/parallel capacitors, or the like) are considered within the scope of the subject disclosure.

In an alternative or additional embodiment, the programming current can be increased or decreased by changing a precharge program voltage applied to a capacitive circuit. Thus, for instance, to increase a program current, a capacitive circuit can be precharged to a suitably larger voltage V (given by the program current relationship, above). Likewise, to decrease the program current, the capacitive circuit can be precharged to a suitably smaller voltage V (also given by the program current relationship).

Referring now to the drawings, FIG. 1 illustrates a circuit diagram of an example system 100 comprising a capacitive programming circuit according to one or more aspects of the subject disclosure. Particularly, system 100 can be implemented as part of a programming circuit for a memory device comprising an array(s) of two-terminal memory cells. Such cells can comprise single bit memory cells, multi-level (e.g., multi-bit) memory cells, or a suitable combination thereof.

System 100 can comprise a power supply 102 connected to one terminal of a first switch 104. A second terminal of first switch 104 can be connected to a capacitive circuit 106 having a capacitance equal to $C_{capacitance\ circuit}$. Although not depicted, capacitive circuit 106 can comprise a conductive electrode of a memory device, such as a bitline, wordline, dataline, etc. Where the capacitive circuit 106 comprises only the conductive electrode, such as a bitline, $C_{capacitance\ circuit}$=capacitance of the bitline. In alternative or additional aspects of the subject disclosure, the capacitive circuit 106 can comprise multiple capacitors. The multiple capacitors can include, for instance, multiple conductive electrodes of the memory device, a conductive electrode connected to one or more capacitors (e.g., a dedicated capacitor element(s)), one or more interconnected capacitors, or the like, or a suitable combination thereof. In this case, $C_{capacitance\ circuit}$=a combined capacitance of the capacitances of the multiple capacitors, depending on series or parallel connections of the multiple capacitors as governed by electronic relationships between capacitors in series or parallel, as suited to a particular multiple capacitance circuit.

To implement programming for a memory cell of a memory device (not depicted), first switch 104 can be closed in conjunction with a precharge segment of a programming operation. Once closed, first switch 104 facilitates electrically connecting power supply 102 to capacitive circuit 106. Capacitive circuit 106 can then accumulate a charge driven by power supply 102. A magnitude of the charge accumulated at capacitive circuit 106 can be a predetermined amount of charge, in response to selected program voltage of power supply 102, and a capacitance value of $C_{capacitance\ circuit}$. As described above, this predetermined amount of charge can be selected to provide a suitable program current for one or more memory cells selected for programming as part of the programming operation.

Following precharging of capacitive circuit 106, first switch 104 can be opened thereby electrically disconnecting power supply 102 from capacitive circuit 106. Completion of the precharging of capacitive circuit 106 can be determined, for instance, by measuring a voltage of capacitive circuit 106 and determining when the measured voltage is equal to the program voltage selected for power supply 102. In an alternative aspect, precharging can be implemented for a particular clock cycle duration, and precharging of capacitance circuit 106 can be completed in response to expiration of the clock cycle.

Once precharging is complete and first switch 104 is opened, system 100 can facilitate programming a memory cell 110. As depicted, capacitance circuit 106 can be electrically connected to a terminal of a second switch 108. A second terminal of second switch 108 can be electrically connected to a memory cell 110. Accordingly, the program voltage of capacitive circuit 106 can be applied to memory cell 110 in response to closing of second switch 108. This program voltage results in charge stored at capacitive circuit 106 to discharge to memory cell 110. Depending on a type of memory cell technology cell employed for memory cell 110, the program voltage or the charge caused by this program voltage will facilitate programming of memory cell 110. In response to programming of memory cell 110, second switch 108 can be opened, electrically disconnecting memory cell 110 from capacitive circuit 106. This can facilitate preserving charge stored at capacitive circuit 106 (e.g., see FIGS. 3-7, infra).

Figure 2:
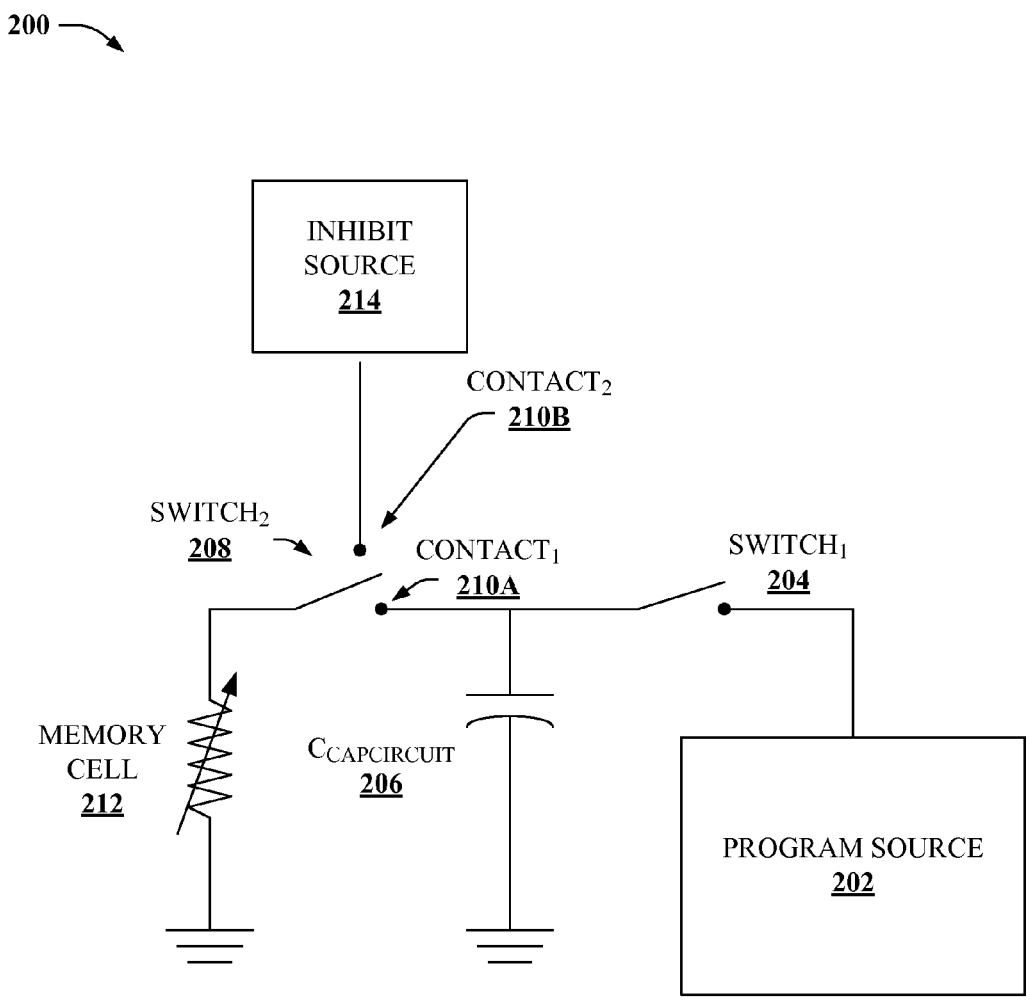
FIG. 2 depicts a circuit diagram of a sample system that provides capacitive programming with an inhibit voltage according to further aspects.

FIG. 2 depicts a circuit diagram of an example system 200 for capacitive programming of two-terminal memory according to additional aspects of the subject disclosure. System 200 can comprise a program source 202 configured to drive a programming voltage for system 200. In some aspects, the programming voltage can be selected from a range of voltages. In other aspects, the programming voltage can be a predetermined fixed voltage.

Program source 202 is connected to a first terminal of a switch 204. A second terminal of switch 204 is connected to a capacitive circuit 206. Capacitive circuit 206 can comprise a conductive electrode of a memory device in some disclosed aspects (e.g., one or more arrays of memory cells, a random access memory module, a Flash memory module, or the like, or a suitable combination thereof). In other aspects, capacitive circuit 206 can comprise one or more capacitor elements. In still other aspects, capacitive circuit 206 can comprise one or more conductive electrodes in conjunction with one or more capacitor elements. In a particular aspect, the capacitive circuit can be a fixed circuit having predetermined capacitance $C_{capacitance\ circuit}$. In other aspects, the capacitive circuit can be dynamically configured to have a subset of conductive electrodes or capacitor elements, facilitating a dynamic and programmable capacitance $C_{capacitance\ circuit}$.

When switch 204 is closed, program source 202 charges capacitive circuit 206. Upon charging of capacitive circuit 206, switch 204 is opened, and a second switch, switch 208 can be connected to first contact 210A. When switch 208 is connected to first contact 210A, capacitive circuit 206 is connected to a memory cell 212 and can program memory cell 212. Upon completion of the programming, switch 208 can be disconnected from first contact 210A and connected instead to a second contact 210B. Second contact 210B connects an inhibit source 214 to memory cell 212. Inhibit source 214 can be programmed to a suitable inhibit voltage (e.g., 1 volt, . . . ) configured to maintain memory cell 212 in an existing state, thereby mitigating or avoiding state changes of memory cell 212 (e.g., to an erase state, a different program state, . . . ). Inhibit voltage is applied to prevent disturb conditions when more than one cell are connected to shared bit lines and word lines.

In a particular aspect of the subject disclosure, system 200 can be configured to perform multi-level programming. For instance, where memory cell 212 is a multi-level memory cell, program source 202 can be configured to output one of a set of program voltages matching respective program levels of the multi-level memory cell. As an example, where the multi-level memory cell is programmed to a first state in response to 3 volts, a second state in response to 5 volts, and a third state in response to 8 volts, program source 202 can be configured to output a respective one of 3, 5, or 8 volts to cause memory cell 212 to be programmed to the corresponding state (e.g., first state, second state, third state). Other similar examples of multi-level memory cells, having a different number of program states, or different program state voltages are considered within the scope of the subject disclosure.

In an alternative or additional aspect, system 200 can be configured to facilitate erasing memory cell 212. In this case, program source 202 can be configured to output a suitable erase voltage associated with erasing memory cell 212. This erase voltage can vary depending on a technology employed for memory cell. For some technologies, the erase voltage might be a small positive voltage (e.g., 0.5 volts), whereas for other technologies the erase voltage might be a negative voltage (e.g., −2.5 volts). In this case, in response to initiation of an erase operation, program source 202 is configured to output a target erase voltage. Switch 204 can be closed to precharge capacitive circuit 206 to the erase voltage, having an associated amount of charge (or, e.g., negative charge). Switch 204 can be opened and switch 208 connected to first contact 210A, to electrically connect memory cell 212 to capacitive circuit 206. Once memory cell 212 is erased, switch 208 can be disconnected from first contact 210A. In some cases, where inhibit source 214 can be programmed to a suitable erase inhibit voltage, switch 208 can be connected to second contact 210B in response to being disconnected from first contact 210A. In other cases, switch 208 can remain open, connected to neither first contact 210A nor second contact 210B.

Figure 3:
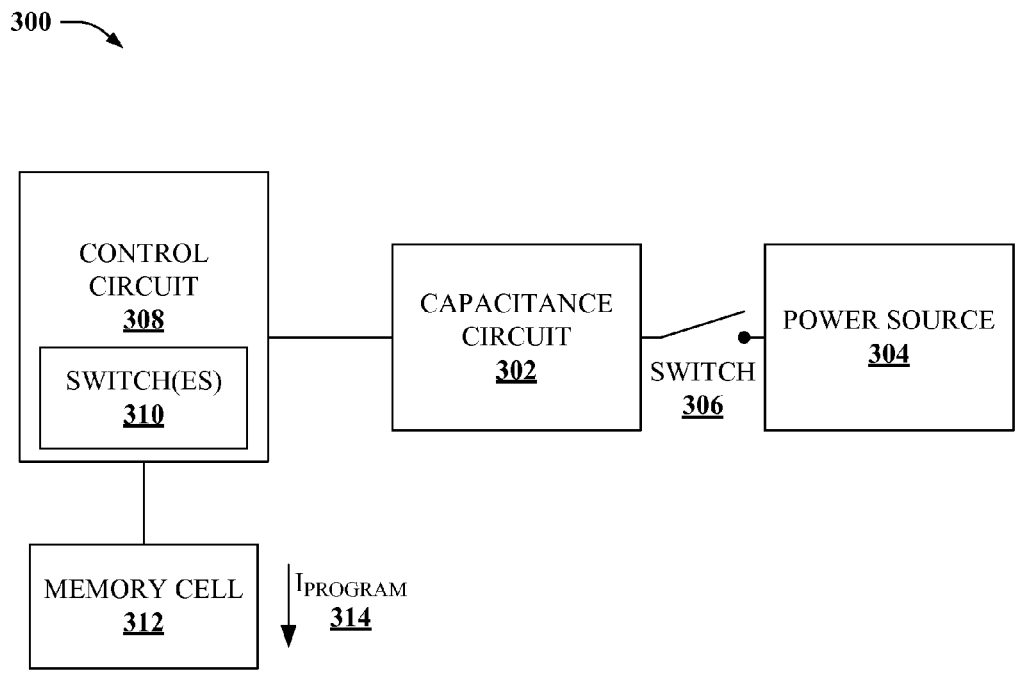
FIG. 3 illustrates a block diagram of an example system that provides program control for capacitive programming in an additional aspect(s).

FIG. 3 illustrates a block diagram of an example system 300 for providing controlled capacitive programming of two-terminal memory in accordance with one or more other aspects disclosed herein. System 300 can comprise a power source 304. Power source 304 can be a preset power source configured to output a single voltage (e.g., a program voltage) in one aspect. In other aspects, power source 304 can be configured to output a voltage within a range of voltage, which can include one or more program voltages, an erase voltage, an inhibit voltage, or the like, or a suitable combination thereof. In addition, system 300 can comprise a capacitance circuit 302 having a capacitance. Capacitance circuit 302 can have a fixed capacitance $C_{capacitance\ circuit}$ in some aspects, or can have a variable capacitance in other aspects. A switch 306 can be configured to electrically connect or electrically disconnect power source 304 to/from capacitance circuit 302. To facilitate programming, erasing, or prohibiting state change of a memory cell, power source 304 is configured to output a voltage (or a suitable voltage within a range of voltages) and switch 306 is closed, electrically connecting power source 304 to capacitance circuit 302. Once capacitance circuit 302 is suitably charged, switch 306 can be opened.

In addition to the foregoing, system 300 can comprise a control circuit 308. Control circuit 308 can be configured to monitor a memory cell(s) 312 and determine a state of memory cell(s) 312. In one aspect, determining the state can be in response to a magnitude of a program current 314 measured at memory cell 312. Control circuit 308 can also be configured to limit the amount of current being sourced to the memory cell to a predetermined maximum current. In another aspect, determining the state can be in response to a magnitude of a program voltage at memory cell 312 (not depicted). Other mechanisms for determining program state known in the art or made known to one of skill in the art by way of the context provided herein are considered within the scope of the subject disclosure.

Control circuit 308 can be configured, via one or more switches 310, to connect or disconnect capacitance circuit 302 with memory cell(s) 312. In some aspects, system 300 can comprise a control circuit 308 for each memory cell 312 of a set of memory cells. In one such aspect, control circuit 308 can connect or disconnect the set of memory cells from capacitance circuit 302 together, while in another such aspect control circuit 308 can be configured to connect or disconnect respective subsets of the set of memory cells from capacitance circuit 302 separately (e.g., via multiple switches 310 respectively situated between respective subsets of the set of memory cells and capacitance circuit 302). In other aspects, system 300 can comprise a control circuit 308 for multiple memory cells, an array of memory cells, a block of memory cells, and so on. According to these latter aspects, a plurality of control circuits 308 can be engaged to monitor respective sets of memory cells 312 for a single program operation, determine a program state of the respective sets of memory cells 312 (or subsets thereof), and connect or disconnect sets (or subsets) of memory cells 312 with capacitance circuit 302, in response to determined program states thereof.

Figure 4:
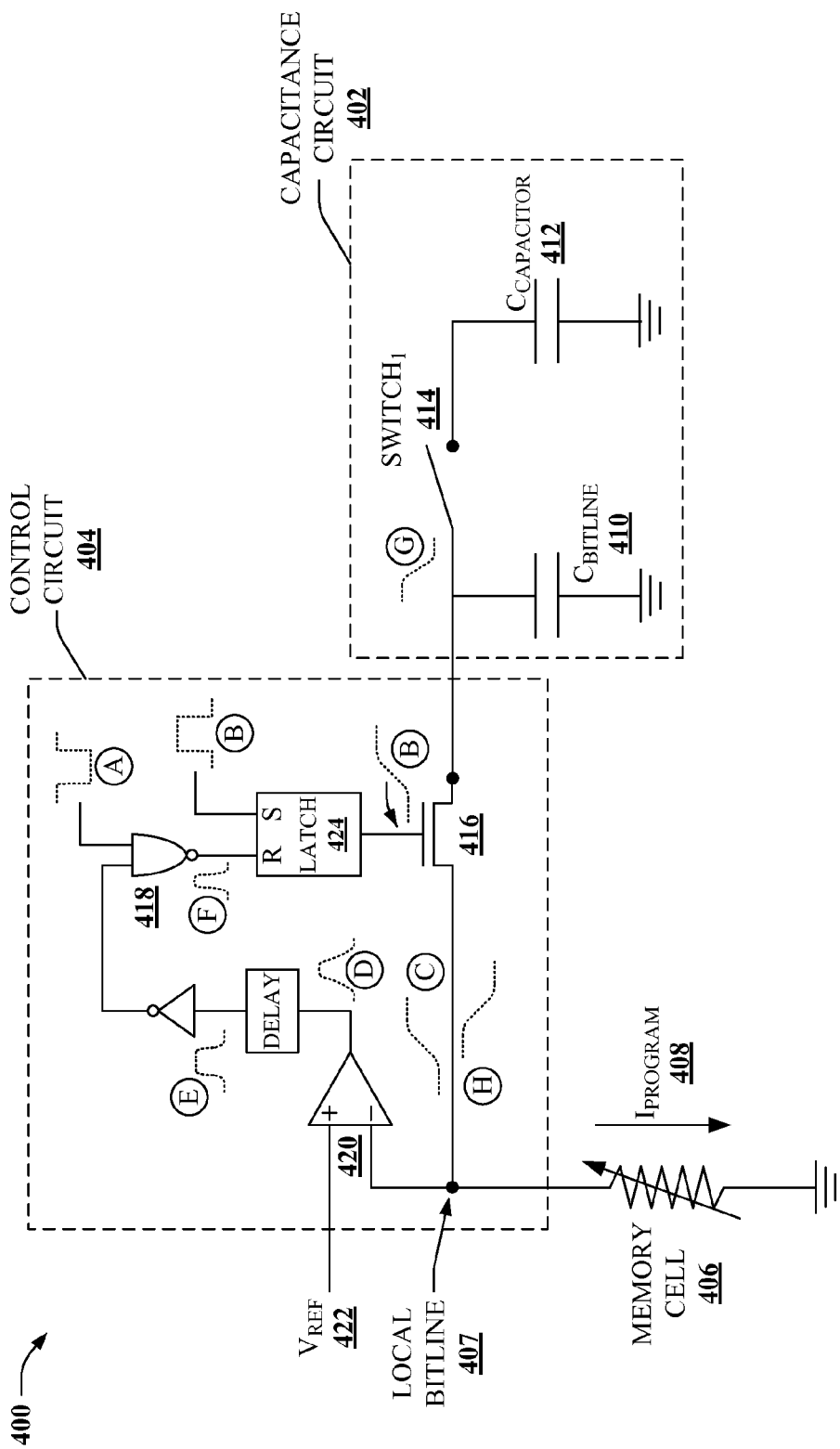
FIG. 4 depicts a circuit diagram of a sample system configured to provide program control for capacitive programming, in a particular aspect.

FIG. 4 depicts a circuit diagram of an example program circuit 400 providing controlled capacitive programming for two-terminal memory according to still other aspects of the subject disclosure. Program circuit 400 can comprise a capacitance circuit 402, a control circuit 404 and a memory cell 406. Memory cell 406 can be a resistive-switching memory cell in some aspects of the subject disclosure; however the disclosure is not limited to these aspects. Rather, other suitable two-terminal memory can be programmed instead of or in addition to resistive-switching memory in various disclosed aspects.

Capacitance circuit 402 can comprise a bitline having a bitline capacitance 410 and a capacitor element having a capacitance 412. A switch 414 can be employed to connect or disconnect the capacitor element from the bitline. A total capacitance of capacitance circuit 402 can be changed by opening or closing switch 414. Particularly, when switch 414 is closed and the capacitor is connected to the bitline, the total capacitance of capacitance circuit 402 is determined by respective capacitances of bitline capacitance 410 and capacitance 412. However, when switch 414 is open, the total capacitance is equal to the bitline capacitance alone.

To facilitate capacitive programming, capacitance circuit 402 can be precharged to a suitable program voltage. As described herein, the program voltage can be selected based on the total capacitance of capacitance circuit 402 (which can depend on whether switch 414 is open or closed) as well as a required program current 408 for programming memory cell 406. In some aspects, memory cell 406 can be a multi-level memory cell, having a first state requiring a first value of program current 408 and an additional state requiring a second value of program current 408. In at least one aspect, respective capacitances values of bitline capacitance 410 or capacitance 412 can correspond with respective ones of the program states of memory cell 406. Thus, for instance, bitline capacitance 410 can correspond with a suitable value of program current 408 required for the first state (at a suitable program voltage), capacitance 412 can correspond with another suitable value of program current 408 required for the additional state (at the suitable program voltage), and a combined capacitance of the bitline and capacitor of capacitance circuit 402 can correspond with a third value of program current 408 required for yet another program state of memory cell 406. Alternatively, the program voltage can be varied to program memory cell 406 to respective program states, instead of changing the total capacitance of capacitance circuit 402. As yet another alternative, a combination of selected capacitance and selected program voltage can be employed for programming memory cell 406 or a set of memory cells.

Control circuit 404 can comprise a switch 416 for connecting or disconnecting capacitance circuit 402 and memory cell 406. As depicted by FIG. 4 and with reference to FIG. 4A for the associated signal waveforms, switch 416 can be controlled by a set-reset latch circuit 424 in response to a pair of signal inputs. However it should be appreciated that the subject disclosure is not limited to the set-reset latch circuit 424, and other suitable control circuits can be employed instead.

An external voltage—denoted on FIGS. 4 and 4A as waveform (A)—is issued prior to programming memory cell 406. The input for this external voltage (A) is at a terminal of a NOR circuit 418. NOR circuit 418 has an output at a reset input, R, of set-reset latch circuit 424, as depicted, and discussed below. Following the pulse of external voltage (A), capacitance circuit 402 is charged to $V_1$. In addition, a reference voltage $V_{REF}$ 422 having a magnitude less than $V_1$ (e.g., $V_{REF}$ 422<$V_1$) is applied at a +input of an amplifier 420. A set waveform (B) is pulsed at the set input of the set-reset latch circuit 424. This activates switch 416, initiating the discharging of capacitance circuit 402 to a local bitline 407 and memory cell 406. If memory cell 406 is programmed in response to connection with capacitance circuit 402, local bitline 407 and capacitance circuit 402 will begin discharging the charge stored at capacitance circuit 402. If memory cell 406 does not become programmed in response to being connected with capacitance circuit 402 and a voltage at local bitline 407>$V_{REF}$ 422, then set-reset latch circuit 424 is reset by a pulse output by NOR circuit 418. $V_{REF}$ 422 is then increased, though still having a magnitude less than $V_1$. The above sequence is repeated beginning with the external reset at the first input of NOR circuit 418, until memory cell 406 is programmed.

FIG. 4A illustrates an example set of waveforms for operating control circuit 404 of program circuit 400 of FIG. 4, supra. Voltage changes in the respective waveforms are denoted by a capital letter, which corresponds with an associated capital letter within control circuit 404 of program circuit 400. As depicted, $V_{REF}$ 402A is maintained at a constant voltage, in this case 2.5 volts though the subject disclosure is not so limited. An external reset waveform 404A is applied at a first terminal of NOR circuit 418. A gate of switch 416 observes the switch gate waveform 406A. Set waveform 408A goes high to activate switch 416 and send switch gate waveform 406A high. In response, a local bitline waveform 410A begins increasing in magnitude until memory cell 406 is programmed. An amplifier output waveform 412A indicates a response at an output terminal of amplifier 420. A delay waveform 414A is observed at an output of a delay circuit that follows amplifier 420, and likewise an R waveform 416A indicates a response at a reset input of latch circuit 424.

Figure 5:
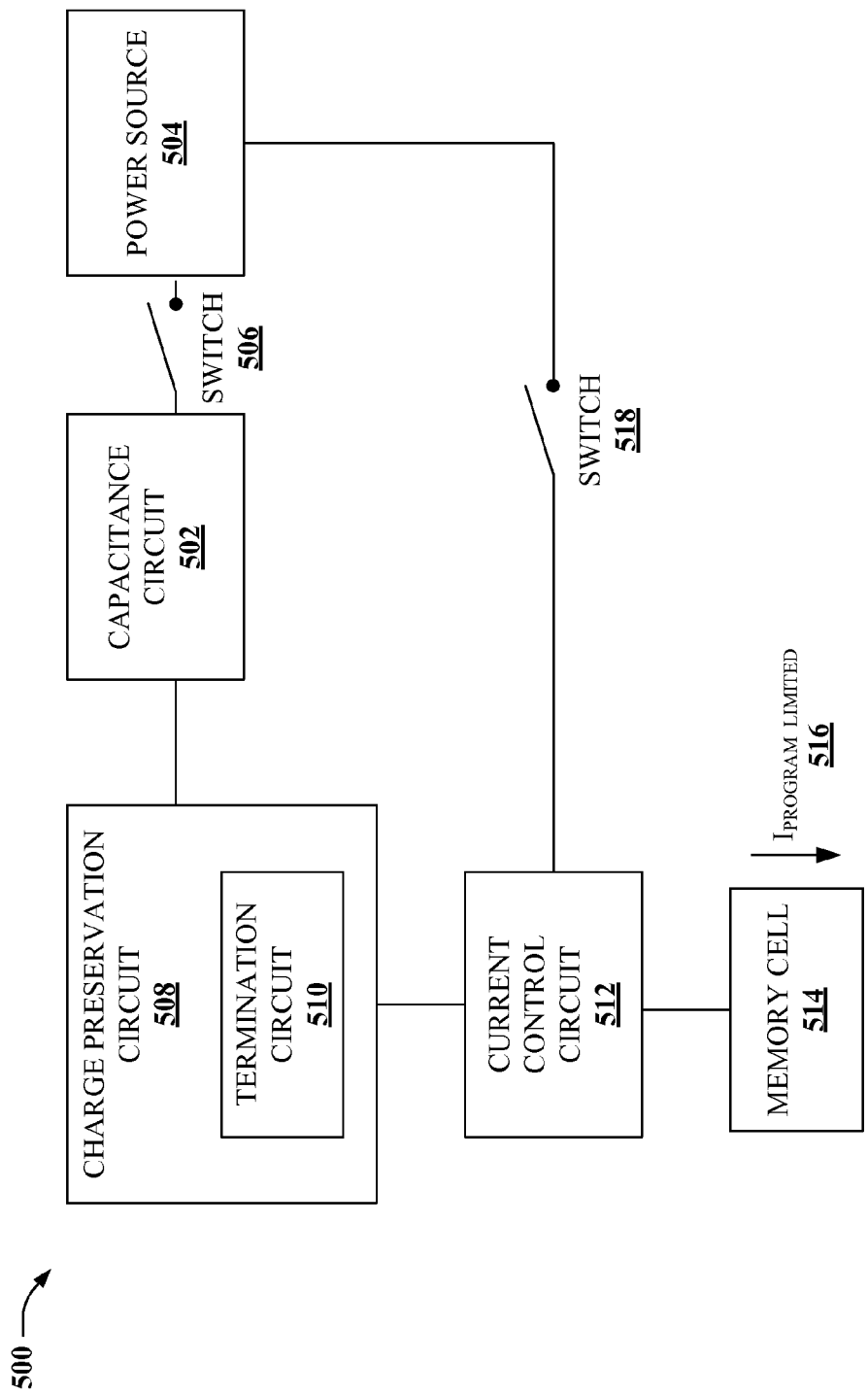
FIG. 5 illustrates a block diagram of an example system that provides program and current control for capacitive programming in further disclosed aspects.

FIG. 5 depicts a block diagram of a sample system 500 for controlled capacitive programming of two-terminal memory according to still other aspects of the subject disclosure. System 500 can be configured to combine capacitive programming with charge preservation in response to programming a memory cell(s) 514, as described above in regard to system 300 of FIG. 3 or program circuit 400 of FIG. 4, supra. In addition, system 500 can incorporate a current limiting circuit to mitigate current spikes at memory cell(s) 514 associated with capacitive programming, further improving power consumption as well as current compliance in memory cell(s) 514.

As depicted, system 500 can comprise a power source 504 and a capacitance circuit 502. Power source 504 can include a program source and an inhibit source in at least one aspect of the subject disclosure. In alternative or additional aspects, power source 504 can output a fixed program voltage and a fixed inhibit voltage. In other aspects, power source 504 can be programmed to a selected voltage within a range of voltages (which can include, e.g., the program voltage, the inhibit voltage, as well as other voltages such as an erase voltage, a plurality of program voltages for multi-level programming, and so on).

Power source 504 can be connected to capacitance circuit 502 by a switch 506. Capacitance circuit 502 can comprise the global bitline, the dataline, etc., of a memory device, in some disclosed aspects, and in additional aspects can further comprise one or more other internal or external capacitor elements. Capacitance circuit 502 can be connected to power source 504 via switch 506, and can be charged to a predetermined program voltage selected for power source 504. After capacitance circuit 502 is charged, switch 506 can be opened.

A charge preservation circuit 508 can be configured to connect or disconnect capacitance circuit 502 with a memory cell(s) 514. One or more switches (not depicted) can be employed for this connection or disconnection. When capacitance circuit 502 is suitably charged, connection with memory cell(s) 514 produces a current at memory cell(s) 514. In the even that memory cell(s) 514 are changed to a program state in response to the connection, a program current 516 flows through memory cell 514. Upon detecting the program current 516 (or a related program voltage, e.g., see FIGS. 3 and 4, supra) a termination circuit 510 disconnects capacitance circuit 502 from memory cell(s) 514, to preserve charge stored at capacitance circuit 502 and also to reduce joule heating at memory cell(s) 514. In at least one aspect of the subject disclosure, power source 504 can be configured to output an inhibit voltage and a switch 518 can be closed to connect the inhibit voltage to memory cell(s) 514 in response to programming of memory cell(s) 514. The inhibit voltage can be generated by a dedicated inhibit source included within power source 504, in one aspect, or can be generated by a programmable voltage source that is programmed to the inhibit voltage in response to programming of memory cell(s) 514 in another aspect.

In addition to the foregoing, system 500 can comprise a current control circuit 512. Current control circuit 512 can limit a magnitude of current flowing through memory cell(s) 514. This serves to reduce instantaneous joule heating of memory cell(s) 514. Such instantaneous joule heating can be increased significantly in response to current spikes, whether inductive current spikes, programming current spikes (e.g., in response to programming of memory cell(s) 514), or the like, or a suitable combination thereof. In a particular aspect, current control circuit 512 can comprise a current mirror that tracks and limits a program current 516 to a maximum program current. The subject disclosure is not limited to this aspect, however, and other circuits known in the art or made known to one of skill in the art by way of the context provided herein can be incorporated within current control circuit 512 in addition to or instead of the current mirror.

Figure 6:
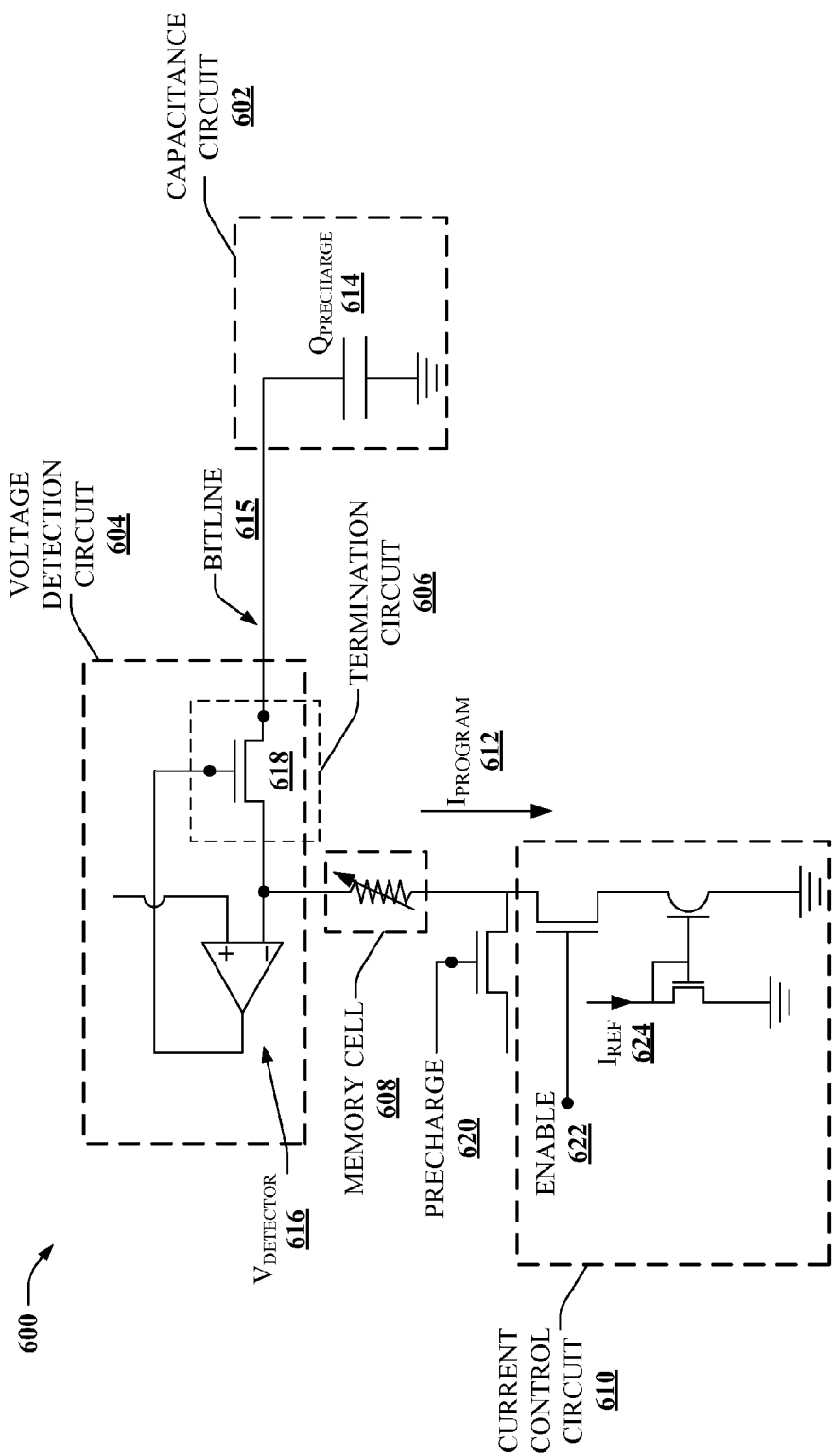
FIG. 6 depicts a circuit diagram of an example circuit configured to provide program and current control for capacitive programming.

FIG. 6 illustrates a circuit diagram of an example program circuit 600 according to particular aspects of the subject disclosure. Program circuit 600 can be configured to provide capacitance programming of a two-terminal memory cell. In addition, program circuit 600 can incorporate charge preservation configured to preserve charge employed for implementing the programming. In addition, program circuit 600 can comprise a current limitation circuit configured to limit a maximum program current observed at the two-terminal memory cell, to mitigate current spikes and associated instantaneous joule heating observed at the two-terminal memory cell.

At a high level perspective, program circuit 600 can comprise a capacitance circuit 602. The capacitance circuit can be connected to a voltage detection circuit 604 which includes a termination circuit 606. Additionally, voltage detection circuit 604 can be connected to a memory cell 608 and a current control circuit 610. Capacitance circuit 602 provides a programming charge to memory cell 608, which can be monitored and terminated by voltage detection circuit 604 and termination circuit 606. In addition, a current at memory cell 608 can be controlled by current control circuit 610.

Capacitance circuit 602 can comprise a capacitor 614 that is precharged to have a predetermined charge, $Q_{precharge}$. Capacitance circuit 602 can be connected to a voltage detection circuit 604 via a global bitline 615. In at least one aspect global bitline 615 capacitance is equivalent to capacitor 614. In other aspects, capacitor 614 can comprise global bitline 615 in addition to one or more other capacitors.

Voltage detection circuit 604 can comprise a voltage detector 616 configured to control a switch 618 of termination circuit 606. Voltage detector 616 can activate switch 618 when memory cell is non-programmed and in response to an activation signal. Once a program voltage is detected at memory cell 608, voltage detector 616 can deactivate switch 618, thereby electrically isolating capacitance circuit 602 from memory cell 608. This serves to preserve charge at capacitance circuit 602 for additional programming, and reduced power consumption.

Figure 7:
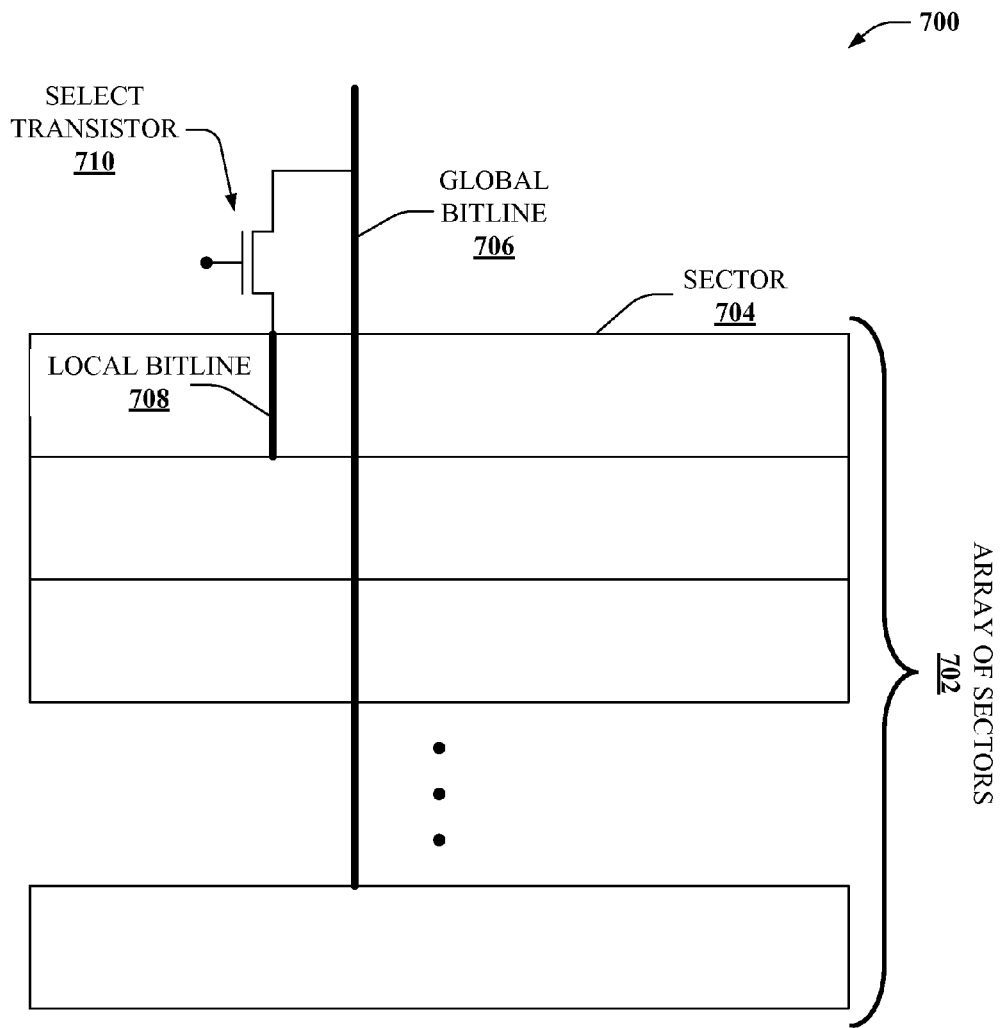
FIG. 7 illustrates a block diagram of an example memory architecture that provides capacitive programming an array of memory cells located on a bit line within a sector.

Program circuit 600 can further comprise a precharge transistor 620 to provide a precharge voltage to memory cell 608 and current control circuit 610. Current control circuit 610 is configured to limit a magnitude of program current 612 observed at memory cell 608. Particularly, current control circuit 610 can comprise an enable signal input 622 to activate current control circuit 610. Moreover, a current reference 624 can be applied to current control circuit 610. A magnitude of the current reference 624 can be configured to be the maximum magnitude for program current 612. Accordingly, the maximum magnitude of program current 612 can be adjusted by a reference current, or Iref, supplied by a current referencing circuit (not depicted here). Thus, for multi-level programming having respective corresponding program current 612 values, a suitable Iref value(s) is set that corresponds to a target multi-level programming value. FIG. 7 illustrates a block diagram of an example memory device 700 configured for capacitive programming according to still other aspects of the subject disclosure. Memory device 700 can comprise an array of memory sectors 702, including respective individual sectors 704 of the array of memory sectors 702. Array of sectors 702 comprises at least one global bitline 706, as depicted. In addition, respective sectors 704 of memory device 700 comprise respective local bitlines 708. Though FIG. 7 illustrates only a single local bitline 708, it should be understood that other sectors 704 of array of sectors 702 can include respective local bitlines 708 as well. Additionally, global bitline 706 is connected to respective local bitlines 708 by respective select transistors 710. Select transistor 710 can be configured to electrically connect or electrically disconnect global bitline 706 and local bitline 708.

In conjunction with a programming operation, global bitline 706 can be charged to a suitable program voltage, containing a charge related to the program voltage and a capacitance of global bitline 706. By closing select transistor 710, global bitline can be electrically connected to local bitline 708, thereby charging local bitline 708 with at least a portion of the charge contained at global bitline. Once local bitline 708 is charged, select transistor 710 can be opened, electrically disconnecting global bitline 706 and local bitline 708. This serves to preserve remaining charge at global bitline 706, which can be utilized to precharge local bitlines of memory device 700 for other programming operations. Furthermore, if the voltage has diminished on the global bitline due to charge sharing, it could be precharged with less current and less time—this will also save power since the global bit line charge is not completely discharged and recharged again.

To program (or erase) a target memory cell associated with local bitline 708, local bitline 708 can be electrically connected to the target memory cell. When the target memory cell is programmed (or erased), the electrical connection can be disconnected, preserving any remaining charge at local bitline 708. Where the remaining charge or voltage on the bitline is sufficient to program (or erase) one or more other memory cells, local bitline 708 can be employed to implement the programming (or erasing) as described herein as long as the remaining charge is sufficient to implement such an operation. When the remaining charge or voltage on the local bitline falls bellow a sufficient level and the memory cell is not programmed yet, local bitline 708 can be reconnected to global bitline via select transistor 710 to be recharged. Likewise, when global bitline 706 comprises too little charge (or voltage drop) to suitably charge a local bitline 708, global bitline 706 can be reconnected to a power supply of memory device 700. In this manner, charge can be controlled from the power supply, to global bitline 706, to local bitline 708. Suitable control of electrical charge can minimize power consumption, reduce joule heating, and preserve long-term efficacy of memory components, optimizing performance of memory device 700.

Figure 8:
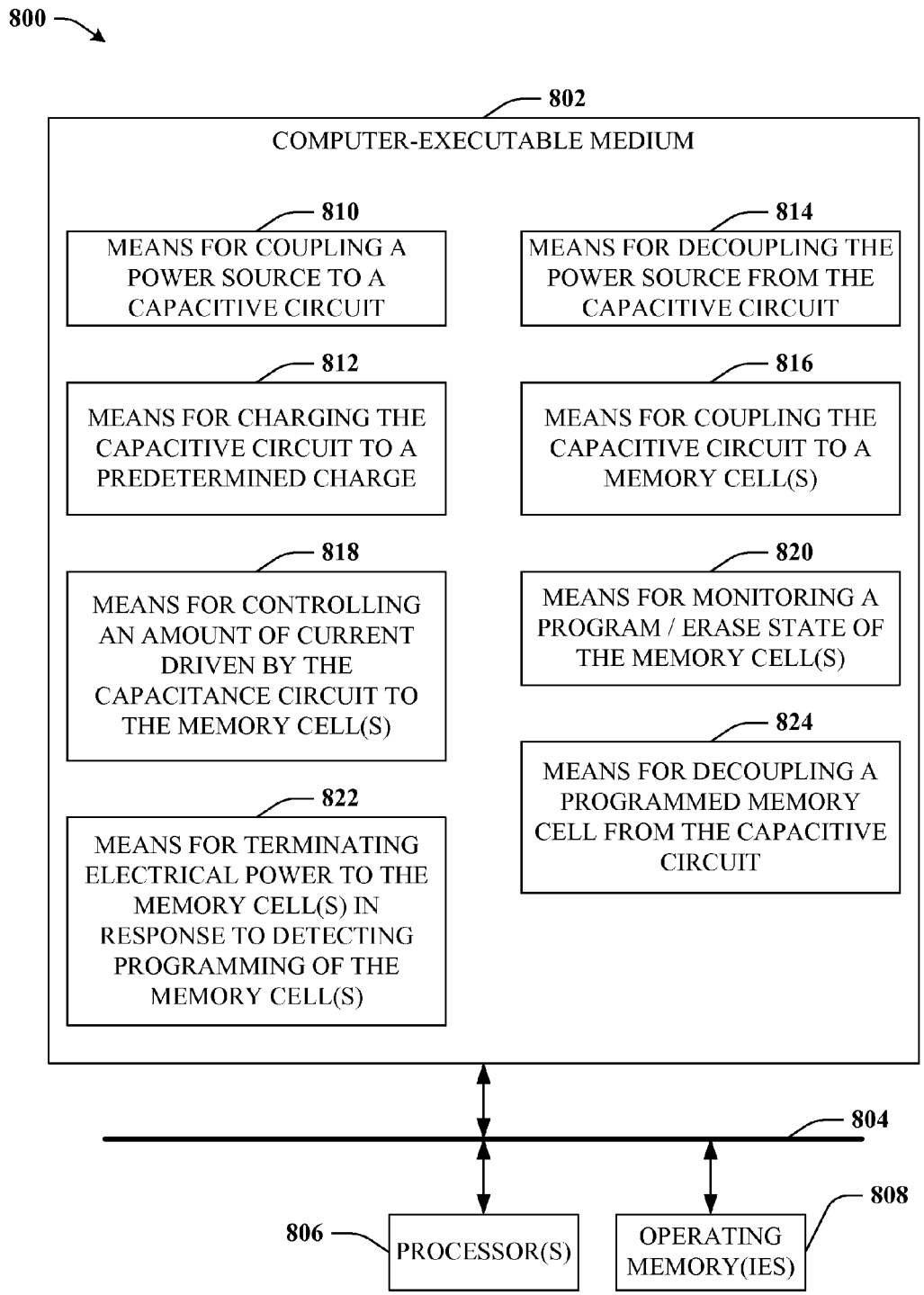
FIG. 8 illustrates a block diagram of an example system that facilitates capacitive discharge programming according to further disclosed aspects.

FIG. 8 illustrates a block diagram of an example system 800 for implementing one or more aspects of the subject disclosure. Particularly, apparatus 800 can be configured for providing facilitating programming of two-terminal memory cells via a capacitive discharge system. For instance, system 800 can reside at least partially within an electronic device, a memory, a memory module, a handheld computer, a personal computer, a networked computer, or the like. It is to be appreciated that system 800 is represented as including functional blocks, which can be functional blocks that represent functions implemented by a hardware, software, or combination thereof (e.g., firmware). In some aspects, the functional blocks can represent non-transitory computer-readable media. In other aspects, the functional blocks can represent transitory computer-readable media.

System 800 can comprise an electronically executable component 802 comprising one or more means for facilitating the capacitive discharge programming of a memory cell(s), and can be operated, executed or accessed over a data communication interface 804. Data communication interface 804 can include a data bus, a dataline, a bitline, a wired or wireless communication interface, or the like, or a suitable combination thereof. In at least one aspect of the subject disclosure, a subset of the means for facilitating the capacitive discharge programming can include computer-executable instructions stored in an operating memory(ies) 808 or executed by a processor(s) 806 to facilitate functionality of system 800.

As depicted, electronically executable component 802 can include a means 810 for coupling a power source to a capacitive circuit. The capacitive circuit can comprise a bitline, dataline, wordline, etc., of an electronic memory, in some aspects. In other aspects, the capacitive circuit can comprise the bitline, dataline, wordline, etc., in conjunction with an external capacitor component. Electronically executable component 802 can further comprise a means 812 for charging the capacitive circuit to a predetermined charge. The predetermined charge can be set to a value that is at least in part related to a capacitance of the capacitive circuit, a program current of one or more memory cells associated with system 800, or a program voltage of the memory cells, or the like. Further to the above, system 800 can comprise a means 814 for decoupling the power source from the capacitive circuit, and a means 816 for coupling the capacitive circuit to one or more memory cells.

In addition to the foregoing, system 800 can comprise a means 818 for controlling an amount of current driven by the capacitance circuit to the memory cell(s). The means 818 for controlling the amount of current can facilitate protecting the memory cell(s) from a spike in current, a rise in current above a threshold magnitude, as well as mitigating power consumption. System 800 can further comprise a means 820 for monitoring a program/erase state of the memory cell(s). System 800 can employ a means 822 for terminating electrical power to one or more memory cell(s) in response to detecting programming of the one or more memory cell(s). Further, system 800 can comprise a means 824 for decoupling a programmed memory cell from the capacitive circuit.

The aforementioned diagrams have been described with respect to interaction between several components, or memory architectures. It should be appreciated that such diagrams can include those components and architectures specified therein, some of the specified components/architectures, and/or additional components/architectures. For example, a memory cell architecture could include a combination of program circuit 400 and system 500. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 9:
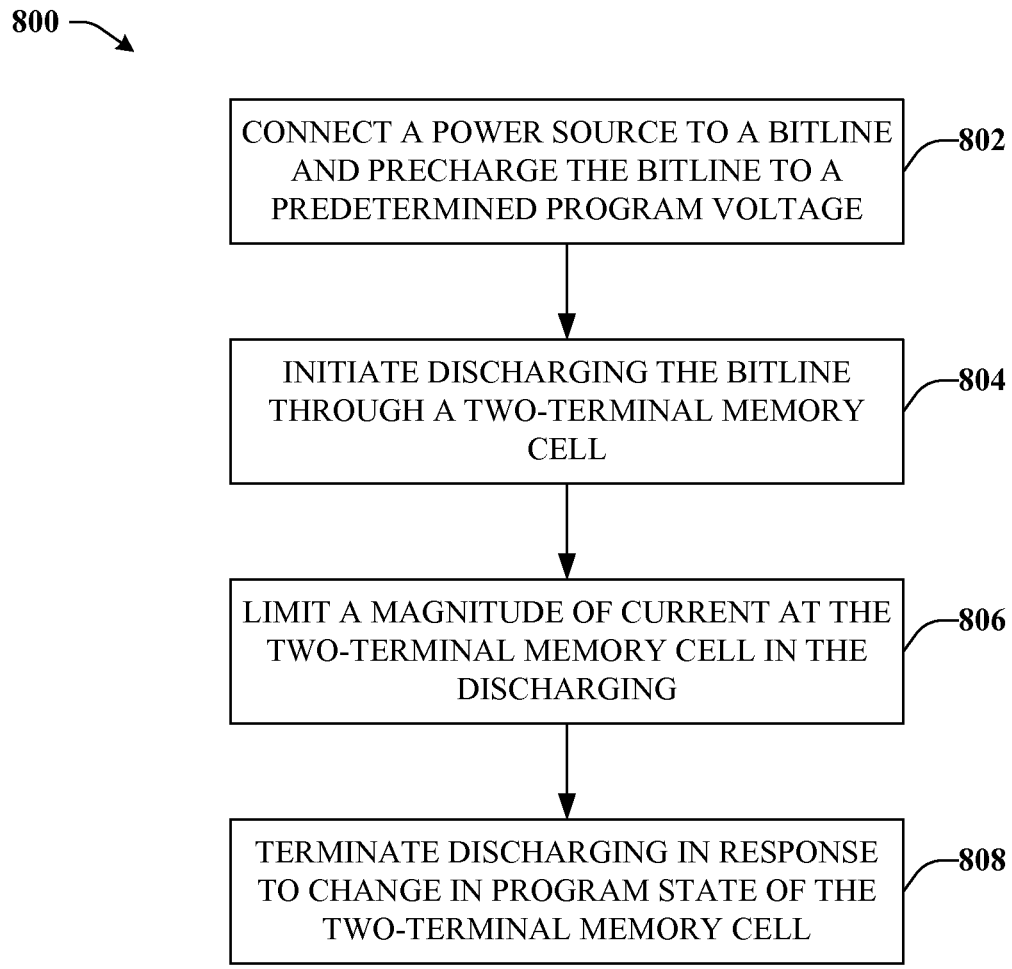
FIG. 9 depicts a flowchart of an example method for providing capacitive programming for two-terminal memory in various aspects.
Figure 10:
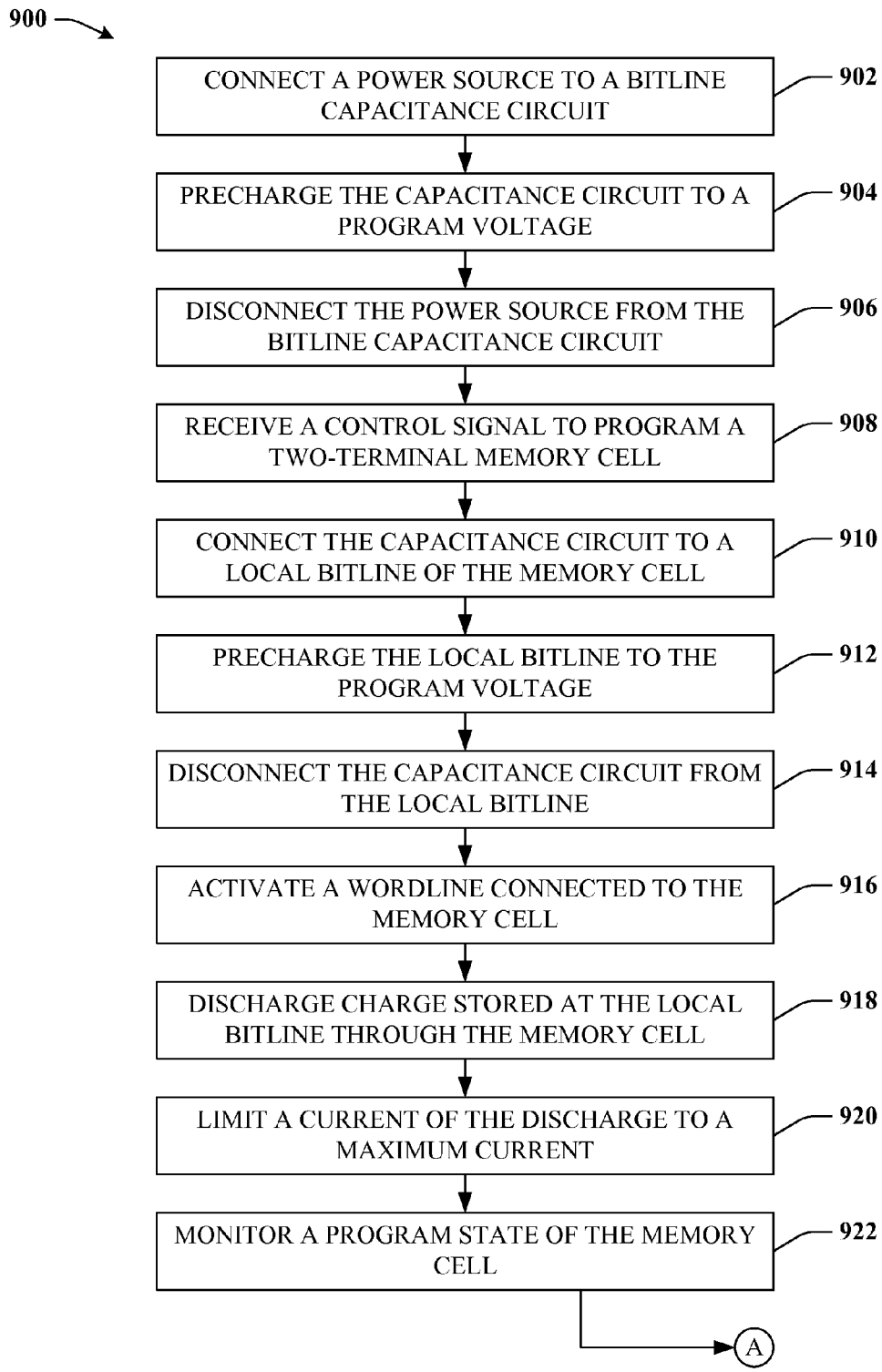
FIGS. 10 and 11 illustrate a flowchart of an example method for providing controlled capacitive programming for two-terminal memory in other aspects.

In view of the exemplary diagrams described supra, process methods that can be implemented in accordance with the disclosed subject matter will be better appreciated with reference to the flow charts of FIGS. 8 through 10. While for purposes of simplicity of explanation, the methods of FIGS. 8 thought 10 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 illustrates a flowchart of a sample method 900 for providing capacitive programming for two-terminal memory according to additional aspects of the subject disclosure. At 902, method 900 can comprise connecting a power source to a conductive electrode (e.g., a bitline) of a memory device and precharging the conductive electrode to a predetermined programming voltage. At 904, method 900 can comprise initiating discharging through a two-terminal memory cell at least a portion of charge stored by a capacitance of the conductive electrode. Initiating the discharging can be in response to the precharging the conductive electrode to the predetermined programming voltage.

At 906, method 900 can comprise limiting a magnitude of current at the two-terminal memory cell that occurs in response to the discharging. Further, at 908, method 900 can comprise terminating discharging of the charge stored by the capacitance of the conductive electrode in response to a change in program state of the two-terminal memory cell. Terminating the discharge in response to the change in program state can significantly reduce power consumption of a memory device, reducing joule heating and improving efficiency of the memory device.

Figure 11:
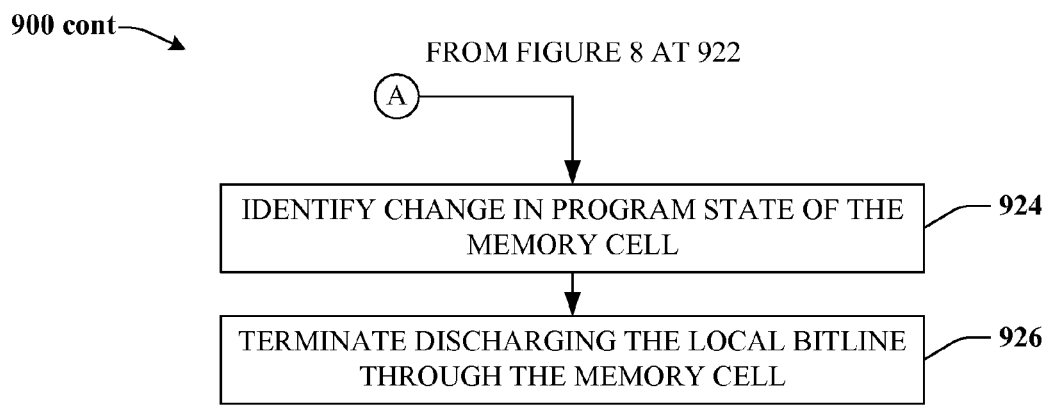

FIGS. 10 and 11 illustrate a flowchart of a sample method 1000 according to still other aspects of the subject disclosure. At 1002, method 1000 can comprise connecting a power source to a bitline capacitance circuit. The bitline capacitance circuit can comprise a bitline of a memory device, and can optionally comprise one or more additional capacitors connected in series or parallel, or a suitable combination thereof, to the bitline of the memory device. In at least one aspect, a subset of the additional capacitors—if present—can be selectively connected to or disconnected from the bitline to selectively control a value of the capacitance of the bitline capacitance circuit.

At 1004, method 1000 can comprise precharging the bitline capacitance circuit to a predetermined program voltage. At 1006, method 1000 can comprise disconnecting the power source from the bitline capacitance circuit. Disconnecting the power source can be in response to a determination that the bitline capacitance circuit has reached the predetermined program voltage, has stored a target amount of charge, or the like.

At 1008, method 1000 can comprise receiving a control signal to program a two-terminal memory cell. At 1010, method 1000 can comprise connecting the bitline capacitance circuit to a local bitline of the memory cell. At 1012, method 1000 can comprise precharging the local bitline to the program voltage. At 1014, method 1000 can comprise disconnecting the bitline capacitance circuit from the local bitline. Disconnecting the bitline capacitance circuit from the local bitline can be in response to determining that the local bitline has been charged to the predetermined program voltage, or has stored a suitable local bitline charge, or the like.

At 1016, method 1000 can comprise activating the word line connected to the selected cell by coupling the wordline to ground. At 1018, method 1000 can comprise initiating programming of the two-terminal memory cell by discharging charge stored at the local bitline through the two-terminal memory cell. At 1020, method 1000 can comprise limiting a current of the discharge to a maximum current value. Further, at 1022, method 1000 can comprise monitoring a program state of the two-terminal memory cell. From 1022, method 1000 can proceed to FIG. 10 at 1024.

Referring now to FIG. 11, method 1000 is continued. At 1024, method 1000 can comprise identifying a change in program state of the two-terminal memory cell. At 1026, method 1000 can comprise terminating the discharging of the local bitline through the two-terminal memory cell in response to identifying the change in program state of the two-terminal memory cell.

Figure 12:
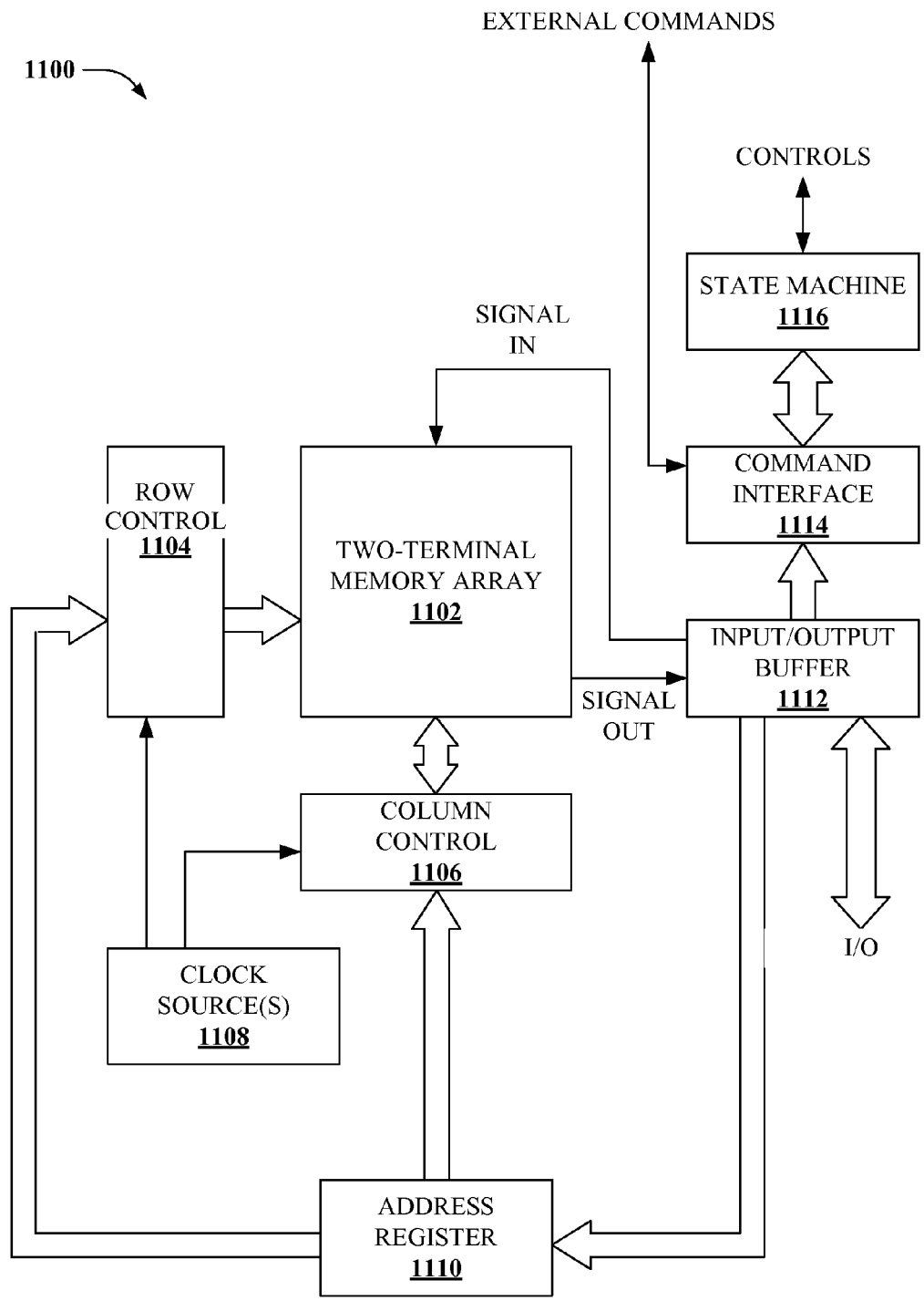
FIG. 12 depicts a block diagram of an example electronic control environment according various additional aspects of the subject disclosure.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules/memory storage devices.

FIG. 12 illustrates a block diagram of an example operating and control environment 1200 for a two-terminal memory array 1202 according to aspects of the subject disclosure. In at least one aspect of the subject disclosure, memory array 1202 can comprise a variety of two-terminal memory cell technology. Further, memory array 1202 can be configured to be programmed via a capacitive discharge programming technique, as described herein.

A column controller 1206 can be formed adjacent to memory array 1202. Moreover, column controller 1206 can be electrically coupled with bit lines of memory array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of memory array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row control 1204 and column control 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted) by way of an I/O buffer or other I/O communication interface. Input/output buffer 1212 can be configured to receive write data, receive an erase instruction, output readout data, and receive address data and command data, as well as address data for respective instructions. Address data can be transferred to row controller 1204 and column controller 1206 by an address register 1210. In addition, input data is transmitted to memory array 1202 via signal input lines, and output data is received from memory array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of memory array 1202. State machine 1216 receives commands from the host apparatus via input/output interface 1212 and command interface 1214, and manages read, write, erase, data input, data output, and like functionality associated with memory array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for programming a two-terminal memory cell, comprising:
    coupling a power source to a capacitor and precharging the capacitor to a programming voltage;
    decoupling the power source from the capacitor when the capacitor has been precharged to the programming voltage; thereafter
    selecting a two-terminal memory cell and connecting the capacitor that has been precharged to the programming voltage to a program terminal of the two-terminal memory cell;
    coupling a second terminal of the two-terminal memory cell to ground;
    controlling a magnitude of current flowing through the two-terminal memory cell in conjunction with the programming; and
    terminating discharging of the charge stored by the capacitance of the bitline in response to a change in program state of the two-terminal memory cell, change in voltage.

2. The method of claim 1, further comprising determining the change in program state of the two-terminal memory cell with a voltage detection circuit.

3. The method of claim 1, further comprising selecting the programming voltage at least in part based on at least one of: a capacitance value of the capacitor, a desired amount of charge for the capacitor or the magnitude of the controlled current.

4. The method of claim 3, wherein selecting the programming voltage is further based on a magnitude of current associated with a change of state of the two-terminal memory cell from one resistance state to a different resistance state.

5. The method of claim 1, wherein precharging the capacitor further comprises precharging an internal or external capacitor in conjunction with a global bitline of a memory device associated with the two-terminal memory cell, a capacitance value of the capacitor comprising a parasitic capacitance associated with the bitline plus a capacitance of the internal or external capacitor.

6. The method of claim 1, further comprising inhibiting discharge of the capacitor beyond a predetermined drop in voltage at the capacitor.

7. The method of claim 1, further comprising coupling the capacitor to the two-terminal memory cell to an inhibit bias in response to terminating the discharging.

8. The method of claim 1, wherein discharging at least the portion of charge further comprises closing a switch between the capacitor and a local bitline on which the two-terminal memory cell is coupled.

9. The method of claim 1, wherein discharging at least the portion of charge further comprises closing a switch between a global bitline of a memory cell serving at least in part as the capacitor and a local bitline associated with a sector of the memory device in which the two-terminal memory cell resides.

10. The method of claim 9, wherein closing the switch between the global bitline and the local bitline further comprises opening a switch between the power source and the global bitline.

11. The method of claim 9, further comprising opening the switch between the bitline and the local bitline in response to precharging the local bitline to the programming voltage.

12. The method of claim 11, wherein connecting the second terminal of the two-terminal memory cell to ground further comprises grounding a wordline connected to the second terminal.

13. The method of claim 1, further comprising activating a wordline of the two-terminal memory cell to facilitate the discharging at least the portion of charge, and floating or inhibiting a local bitline connected to a second two-terminal memory cell on the wordline, to facilitate inhibiting programming of the second two-terminal memory cell.

14. The method of claim 1, further comprising activating a wordline of a memory device connected to the two-terminal memory cell and connected to a second two-terminal memory cell, and connecting respective local bitlines of the memory device to the capacitance, wherein the respective local bitlines are connected respectively to the two-terminal memory cell and to the second two-terminal memory cell, and further wherein discharging at least the portion of charge comprises discharging similar portions of the charge stored by the capacitor through the two-terminal memory cell and the second two-terminal memory cell to facilitate concurrent programming of multiple two-terminal memory cells.

15. The method of claim 14, further comprising selecting a value of the programming voltage or an amount of charge for precharging the bitline at least in part based on a number of the multiple two-terminal memory cells.

16. A semiconductor memory device, comprising:
a power source configured to generate and output a selected voltage within a predetermined range of voltages;
a global bitline and a wordline, the bitline having an associated bitline capacitance value;
a two-terminal memory cell connected at one terminal to the wordline and connected at a second terminal to a local bitline,
a select transistor configured to electrically connect or electrically isolate the two-terminal memory cell and the local bitline from the global bitline in response to activation or deactivation of the select transistor; and
a program control circuit configured to set the selected voltage to a program voltage value; precharge the global bitline to the program voltage value and initiate discharging the precharged global bitline through the two-terminal memory cell to facilitate programming the two-terminal memory cell;
a current inhibitor circuit configured to limit a current through the two-terminal memory cell in response to the discharging; and
a charge preservation circuit configured to identify a change in program state of the two-terminal memory cell, and to terminate the discharging in response to identifying the change in program state.

17. The semiconductor memory device of claim 16, the two-terminal memory cell comprising a resistive random access memory, a phase-change random access memory, a magnetoresistive random access memory, or a ferroelectric random access memory.

18. The semiconductor memory device of claim 16, wherein the program control circuit is further configured to open the select transistor in conjunction with precharging the global bitline to the program voltage, electrically isolate the global bitline from the power source following the precharging the bitline to the program voltage, and closing the select transistor to electrically connect the global bitline to the two-terminal memory cell to facilitate the discharging at least a portion of stored charge from the bitline to the two-terminal memory cell in conjunction with the facilitating programming the two-terminal memory cell.

19. A memory circuit, comprising:
an electrical switch that selectively connects and disconnects a voltage supply to a capacitance circuit comprising a global bitline connected to a capacitor;
a set of second electrical switches that, respectively, selectively connect and disconnect the capacitance circuit to respective ones of a set of local bitlines associated with memory cells of the memory circuit;
a control circuit configured to charge the capacitance circuit and the set of local bitlines and limit an amount of charge consumed in programming the memory cells to a maximum charge, wherein:
the control circuit:
closes the electrical switch in response to initiation of a program operation;
charges the capacitance circuit;
opens the electrical switch in response to charging the capacitance circuit and closes at least one of the set of second electrical switches to charge a plurality of the set of local bitlines from the capacitance circuit, to facilitate discharging a program current through a plurality of memory cells connected to respective ones of the plurality of the set of local bitlines,
a total capacitance of the capacitance circuit comprises a parasitic capacitance of the global bitline and a capacitance value of the capacitor.

20. The memory circuit of claim 19, further comprising a termination circuit that detects a value of the program current or voltage drop at one of the memory cells and opens a corresponding one of the set of second electrical switches in response to the program current reaching a predetermined current amount.

* * * * *